United States Patent [19]

Kon et al.

[11] Patent Number: 5,726,521
[45] Date of Patent: Mar. 10, 1998

[54] ELECTROMECHANICAL ACTUATOR USED IN WIRE-DOT PRINTING HEAD

[75] Inventors: Shinji Kon; Syuichi Yamaki; Mitsuhiro Yoshida, all of Inagi; Daisuke Kimura, Kawasaki; Shigeo Miura, Kawasaki; Yuji Oshime, Kawasaki; Mitsuhiro Mori, Inagi, all of Japan

[73] Assignee: Fujitsu Limited, Kawasaki, Japan

[21] Appl. No.: 766,055

[22] Filed: Dec. 16, 1996

Related U.S. Application Data

[60] Continuation of Ser. No. 388,890, Feb. 14, 1995, abandoned, which is a division of Ser. No. 107,567, Aug. 18, 1993, abandoned.

[30] Foreign Application Priority Data

| Aug. 18, 1992 | [JP] | Japan | 4-219140 |
| Sep. 10, 1992 | [JP] | Japan | 4-241893 |
| Aug. 12, 1993 | [JP] | Japan | 5-200775 |

[51] Int. Cl.⁶ .................................. H01L 41/08
[52] U.S. Cl. ........................... 310/328; 101/93.05
[58] Field of Search ............................ 310/323, 328; 400/124.16, 124.21, 124.22; 101/93.04, 93.05, 93.48

[56] References Cited

U.S. PATENT DOCUMENTS

| 3,473,466 | 10/1969 | Thayer | 101/93.04 |
| 3,614,486 | 10/1971 | Smiley | 310/323 |
| 3,649,857 | 3/1972 | Knappe | 310/328 |
| 3,919,934 | 11/1975 | Beery | 310/328 |
| 4,140,406 | 2/1979 | Wolf et al. | 400/124 |
| 4,193,703 | 3/1980 | Sakmann | 400/124 |
| 4,342,935 | 8/1982 | Kallmeyer et al. | 310/328 |
| 4,435,666 | 3/1984 | Fukui et al. | 310/328 |
| 4,454,441 | 6/1984 | Taniguchi | 310/328 |
| 4,568,207 | 2/1986 | Hara et al. | 400/124 |
| 4,639,630 | 1/1987 | Rodloff et al. | 310/328 |
| 4,783,610 | 11/1988 | Asano | 310/328 |
| 4,874,978 | 10/1989 | Sakaida et al. | 310/328 |
| 4,929,100 | 5/1990 | Patterson et al. | 400/124 |
| 4,976,553 | 12/1990 | Yamaguchi et al. | 400/124 |
| 5,028,834 | 7/1991 | Sakaida et al. | 310/328 |
| 5,046,872 | 9/1991 | Chang et al. | 310/328 X |
| 5,214,341 | 5/1993 | Itoh et al. | 310/328 X |
| 5,289,074 | 2/1994 | Mori | 310/328 X |

FOREIGN PATENT DOCUMENTS

| 0 155 816 | 9/1985 | European Pat. Off. |
| 0 162 586 | 11/1985 | European Pat. Off. |
| 0 295 102 | 12/1988 | European Pat. Off. |
| 0 333 595 | 9/1989 | European Pat. Off. |

(List continued on next page.)

OTHER PUBLICATIONS

Meier et al., "Matrix Printer Wire Actuator," *IBM Technical Disclosure Bulletin*, vol. 20, No. 11B, Apr. 1978, p. 4748.
Meier et al., "Matrix Printer Wire Actuator," *IBM Technical Disclosure Bulletin*, vol. 20, No. 11B, Apr. 1978, p. 4748.

*Primary Examiner*—Mark O. Budd
*Attorney, Agent, or Firm*—Staas & Halsey

[57] ABSTRACT

An electromechanical actuator has a stack composed of electromechanical elements, and an inactive element intervening in the stack to divide it into two sections. In a wire-dot printing head using the actuator, the stack sections are successively energized to increase a forward stroke of a printing wire for a high speed printing. In another aspect, an electromechanical actuator used in a wire-dot printer has a spring for regulating and braking a rearward stroke of a printing wire or a stopper such that the wire can be prevented from being moved back beyond an initial position. Alternatively, a stopper is incorporated to forcibly stop the wire at the initial position during the rearward stroke thereof. In yet another aspect, an electromechanical actuator has a stack composed of electromechanical elements, and the stack is supported by a block through a leaf spring securely joined therebetween to prevent generation of large stress in the stack.

21 Claims, 21 Drawing Sheets

FOREIGN PATENT DOCUMENTS

| | | |
|---|---|---|
| 0 407 184 | 1/1991 | European Pat. Off. |
| 0 536 637 | 4/1993 | European Pat. Off. |
| 0 569 253 | 11/1993 | European Pat. Off. |
| 35 40 761 | 11/1985 | Germany |
| 61-233559 | 10/1986 | Japan |
| 4-82743 | 5/1987 | Japan |
| 2-141272 | 5/1990 | Japan |
| 3-121843 | 12/1991 | Japan |
| 1 568 457 | 5/1980 | United Kingdom |
| 2 251 825 | 7/1992 | United Kingdom |
| 2 267 684 | 12/1993 | United Kingdom |
| 2 268 334 | 1/1994 | United Kingdom |

ELECTROMECHANICAL ACTUATOR USED IN WIRE-DOT PRINTING HEAD

This application is a continuation of application Ser. No. 08/388,890, filed Feb. 14, 1995, now abandoned, which is a division of application Ser. No. 08/107,567, filed Aug. 18, 1993, now abandoned.

BACKGROUND OF THE INVENTION

1) Field of the Invention

The present invention relates to an electromechanical actuator which can be advantageously used in a printing head of a wire-dot printer, and also relates to such a printing head which includes a plurality of printing wire elements individually driven by electromechanical actuators.

2) Description of the Related Art

As is well known, a wire-dot printer represents an impact printer, in which characters, symbols and the like are formed as a dot-image by selectively driving the plural printing wire elements. These printers are in wide-spread use as office type printers because the running (i.e., operating) thereof are relatively low, but there is a demand for a wire-dot printer exhibiting a higher printing speed and a longer operating life than afforded by conventional such printers.

Conventionally, an electromagnetic-type actuator has been used in the printing head of the wire-dot printer as an actuator for driving the printing wire element. Nevertheless, this electromagnetic-type actuator consumes a large amount of electric power, and there is a limit to improving the printing speed.

As another type of actuator for driving the printing wire element, a piezoelectric-type actuator has been recently developed, as disclosed in, for example, Japanese Unexamined Patent Publications (Kokai) No. 1-110160 and No. 1-237156. This piezoelectric-type ("piezo") actuator includes a piezo stack composed of a plurality of piezo elements integrally held by a tie band, and the piezo stack is disposed adjacent to a support block member. In particular, the block member has a front end and a rear end, and the piezo stack is disposed between two front and rear portions integrally extended from the front and rear ends of the block member, such that the front end of the piezo stack is placed beside the front extended-portion of the block member and the other end, or rear end, thereof is securely connected to the rear extended-portion of the block member. The actuator further includes an arm lever, one end of which is supported by the block member and the piezo stack through the intermediary of two parallel leaf spring elements securely connected thereto, and the other end of the arm lever has a printing wire element securely attached thereto. When the piezo stack is electrically energized such that the height or length thereof is increased, the arm lever is rotated about a middle point of a span length of the leaf spring element extended between the arm lever and the front extended-portion of the block member, and thus the printing wire can execute a forward stroke to mark a dot. After the energizing of the piezo stack is ended, the printing wire element executes a rearward stroke due to the resilient force of the leaf spring elements, and is then returned to an initial position. With the arrangement as mentioned above, although the increment of the height or length of the piezo stack is very small (about 10 μm), it can be amplified by the arm lever so that the printing wire element can execute the forward stroke in a displacement of several hundreds of microns, as in necessary to mark the dot.

A consumption of electric power by the piezoelectric-type actuator is smaller than that by the electromagnetic-type actuator, and also the printing speed of the former comprises favorably with that of the latter. Nevertheless, when the printing speed of the piezoelectric-type actuator is to be further facilitated, some problems must be solved. In particular, to achieve an increased printing speed of the piezoelectric-type actuator, the forward stroke of the printing wire element must be made slightly larger than the normal forward stroke thereof, but the application of electric energy to the piezoelectric-type actuator must be considerably increased to obtain only a slight incremental increase in the forward stroke of the printing wire element. In this case, the printing wire element may penetrate into a recording medium, such as a sheet of paper, due to the increase in electric energy, resulting in damage to the sheet of paper.

Also, when the printing speed of the piezoelectric-type actuator is increased, the frequency of application of electric energy to the actuator must be increased, and thus each of the forward and rearward strokes of the printing wire element is performed at a higher speed. In this case, the rearward stroke of the printing wire element becomes larger, so that the printing wire element is moved back beyond the initial position. Thus, the leaf spring element extended between the arm lever and the front extended-portion of the block member is subjected to a tensile stress, whereas the leaf spring element extended between the arm lever and the front end of the piezo stack is subjected to a compressive stress. The leaf spring exhibits a strong durability against the tensile stress, but it can be more easily broken by the compressive stress. Accordingly, the leaf spring element which is extended between the arm lever and the front end of the piezo stack can be prematurely broken when the printing speed is increased.

Further, when the printing wire element is moved back beyond the initial position, it cannot stop immediately at the initial position because of an oscillation thereof. Accordingly, when the printing wire element is at a rearward position with respect to the initial position and is electrically energized, the printing wire element cannot execute a sufficient forward stroke, resulting in a deterioration of print quality.

In the piezoelectric-type actuator as mentioned above, it is possible to positively support the piezo stack by the support block member. For example, U.S. Pat. No. 4,874,978 suggests the use of a parallelogram link member for support of the piezo stack by the block member. In particular, the piezo stack is supported by the block member through the intermediary of the parallelogram link member, opposed sides of which are securely attached to the piezo stack and the block member, respectively, so as to allow a change of height or length of the piezo stack. Nevertheless, the piezo stack is subjected to a relatively large load due to the secure attachment of the parallelogram link member to the piezo stack, and this hinders a further increase of printing speed of the piezoelectric-type actuator. Also, the restriction of the piezo stack by the parallelogram link member is relatively strong, and thus the piezo stack is subjected to a large bending stress when it is electrically energized.

SUMMARY OF THE INVENTION

Accordingly, an object of the present invention is to provide an electromechanical-type actuator which can be advantageously used in a printing head for a wire-dot printer, and which is constituted such that a printing speed can be increased in comparison with an conventional electromechanical-type printing head without damaging a recording medium such as a sheet of paper.

Another object of the present invention is to provide an electromechanical-type actuator which can be advantageously used in a printing head for a wire-dot printer, and which is constituted such that the printing speed can be increased in comparison with a conventional electromechanical-type printing head without any premature breakages of the drive mechanism thereof, whereby a proper printing operation of the printing head can be ensured over a long period of time.

Yet another object of the present invention is to provide a printing head for a wire-dot printer in which electromechanical-type actuators as mentioned above are used.

Yet another object of the present invention is to provide an electromechanical-type actuator, as mentioned above, wherein a stack composed of a plurality of electromechanical elements can be positively supported by a block member without being subjected to a large load.

In accordance with a first aspect of the present invention, there is provided an electromechanical actuator comprising a stack composed of electromechanical elements; an inactive element intervened in the stack so as to divide the stack into two stack sections; and an electric energy supply source for individually energizing the stack sections. Each of the electromechanical elements may be a piezoelectric element.

Also, in accordance with the first aspect of the present invention, there is provided a printing head for a wire-dot printer comprising: a plurality of electromechanical actuators, each of which includes a stack composed of electromechanical elements, and an inactive element intervened in the stack so as to divide the stack into two stack sections; and a printing wire element, incorporated in each of the electromechanical actuators, to drive a printing wire element at a forward stroke for printing, the forward stroke of the printing wire element being carried out by successively energizing the two stack sections to increase the printing speed. Each of the electromechanical elements may be a piezoelectric element.

In accordance with a second aspect of the present invention, there is provided an electromechanical actuator comprising: an electromechanical unit resiliently associated with a member to be driven, such that the member is driven from an initial position to an operative position when the electromechanical unit is energized; and a resilient regulation unit for resiliently regulating the member which is returned from the operative position toward the initial position when the electromechanical means is deenergized. Preferably, the resilient regulation unit is constituted such that the member is more strongly regulated during the return of the member from the operative position to the initial position. The electromechanical unit may comprise a piezoelectric means, and the member may be a printing wire element incorporated in a wire-dot printing head.

In accordance with the second aspect of the present invention, there is provided a printing head for a wire-dot printer: a plurality of electromechanical actuators, each of which is resiliently associated with a printing wire element such that the printing wire element is driven from an initial position to a printing position; and a resilient regulation unit incorporated into each of the electromechanical actuators, for resiliently regulating the printing wire element which is returned from the printing position toward the initial position when the electromechanical actuator is deenergized. A stopper may be substituted for the resilient regulation unit, and is associated with all of the electromechanical actuators for stopping the printing wire elements at the initial position when the printing wire element is returned from the printing position toward the initial position upon the deenergizing of the electromechanical actuator. Preferably, the stopper includes a flexible sheet for protecting the stopper face of the stopper from being worn. In this case, the stopper face of the stopper may be formed as a toothed face which is constituted such that the flexible sheet is subjected to a rotational force when being hit by the driven member.

In accordance with a third aspect of the present invention, there is provide an electromechanical actuator comprising: a stack unit composed of electromechanical elements; a support block disposed beside the stack unit; a leaf spring securely joined to the stack unit and the support block, whereby the stack unit is supported by the support block through the intermediary leaf spring. Each of the electromechanical elements may be a piezoelectric element.

BRIEF DESCRIPTION OF THE DRAWINGS

Other objects and advantages of the present invention will be better understood from the following description, with reference to the accompanying drawings in which:

FIG. 29 (B) is a perspective view of a leaf spring through which a piezo stack is supported by a block member in the piezoelectric-type actuator shown in FIG. 29(A);

DESCRIPTION OF THE PREFERRED EMBODIMENTS

Figure 1:
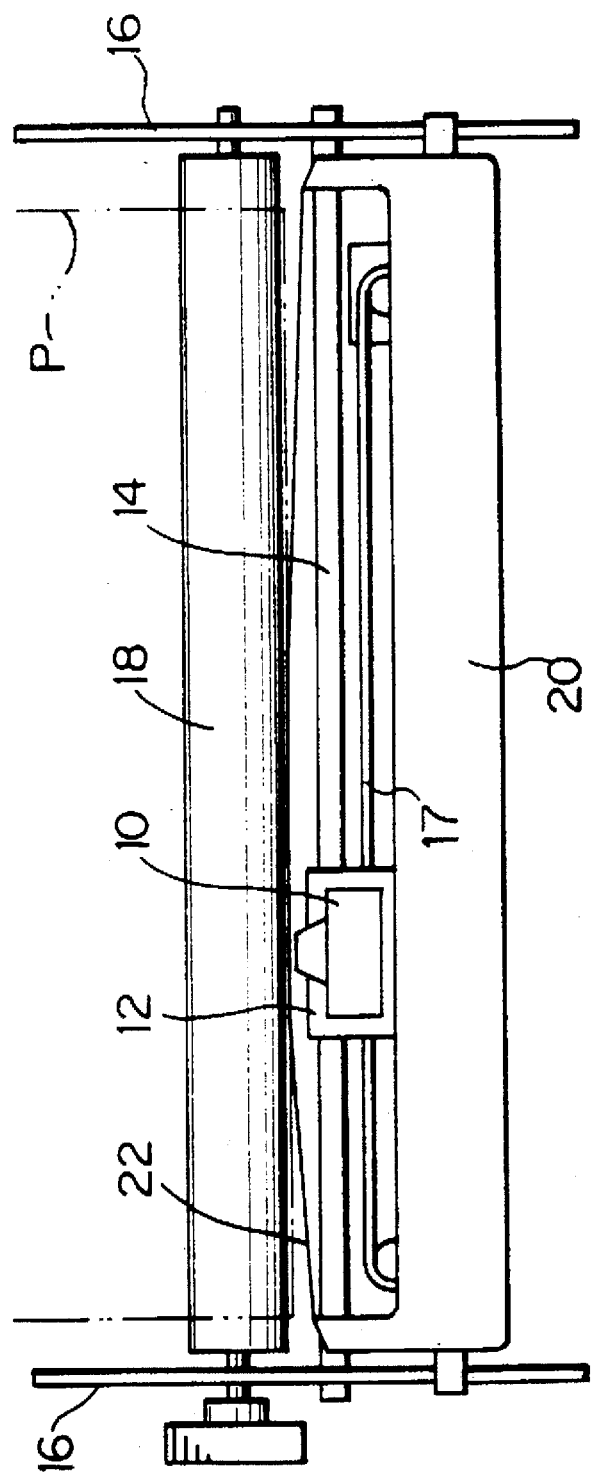
FIG. 1 is a plan view of a wire-dot printer in which the present invention can be embodied.

FIG. 1 schematically shows a part of a wire-dot printer having a piezoelectric-type printing head 10 in which the present invention can be embodied. The printing head 10 is attached to and supported by a carrier 12 which is slidably mounted on a guide bar 14 which extends between and is supported by two side frames 16 of the printer. During operation of the printer, the carrier 12 with the printing head 10 is moved along the guide bar 14 by an endless drive belt 17 to which the carrier 12 is connected. The printer includes a platen 18 rotatably supported by the side frames 16 and disposed in parallel with the guide bar 14, and an ink ribbon cassette 20 detachably mounted on a support member extended between the side frames 16. The ink ribbon cassette 20 contains an endless ink ribbon, a portion 22 of which is exposed from the cassette 20 and is run through a space defined between the printing head 10 and the platen 18, as shown in FIG. 1. During the operation of the printer, a sheet of paper P, which is shown by a phantom line in FIG. 1, is passed through a space between the platen 18 and the exposed portion 22 of the ink ribbon.

Figure 2:
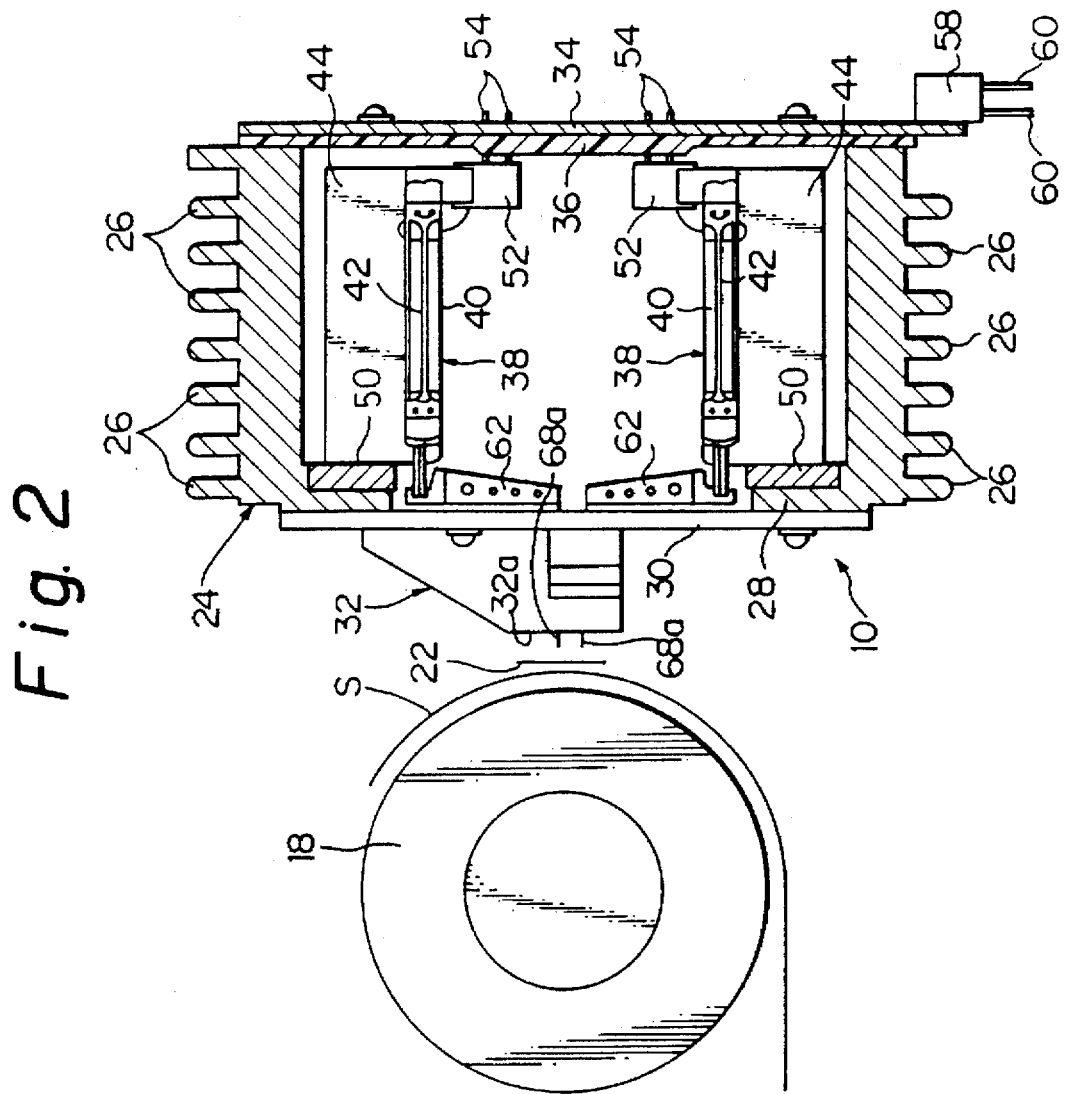
FIG. 2 is a vertical cross-sectional view of a printing head of the printer shown in FIG. 1.

As shown in detail in FIG. 2, the printing head 10 comprises an annular housing 24 formed of a suitable metal such as steel, and the housing 24 has heat-radiating fins 26 extended outwardly from an outer side wall thereof, and an inner flange 28 extended inwardly from an inner peripheral edge of a front annular end thereof. The printing head 10 also comprises a disk-like plate 30 securely attached to the inner flange 28 of the housing 24 and having a nose member 32 integrally formed thereon, and a printed circuit board 34 securely attached to the other or rear annular end of the housing 24 through the intermediary of a suitable rubber sheet 36.

For example, the printing head 10 comprises twenty four piezo electric-type actuators 38 accommodated in the housing 24 and annularly arranged along an inner wall surface thereof at regular intervals. As shown in detail in FIG. 3, each of the piezoelectric-type actuators 38 includes a piezo stack 40 composed of a plurality of piezo elements integrally held by a tie band 42. The piezo stack 40 is disposed adjacent to and partially supported by a support block member 44. In particular, the block member 44 has a front end and a rear end, and the piezo stack 40 is disposed between two front and rear portions 44a and 44b integrally extended from the front and rear ends of the block member 44. The piezo stack 40 has a block piece 46 securely joined to a front end thereof, and the block piece 46 is placed beside the front extended-portion 44a of the block member 44. The other end or rear end of the piezo stack 40 is securely connected to an end of a screw 48 threaded in the rear extended-portion 44b of the block member 44. As shown in FIG. 2, the block member 44 is securely attached to and supported by the inner flange 28 of the housing 24 through the intermediary of a ring member 50.

A connector 52 is attached to the rear extended-portion 44b of the block member 44, and has a pair of connecting pins 54 which are inserted into the printed circuit board 34, as shown in FIG. 2, and which are electrically connected to plus and minus electrode terminals of the piezo stack 40 through a pair of electric leads 56a and 56b. Also, a multi-connector 58 is mounted on the printed circuit board 34, as shown in FIG. 2, and has a plurality of connecting pins 60 which are electrically connected to a control circuit board (not shown) of the printer through a flexible flat cable (not shown). Of course, the respective connecting pins 60 of the multi-connector 58 are connected to the connecting pins 54 of the twenty four connectors 52 through a circuit pattern formed on the circuit board 34, and thus the twenty four piezo stacks 40 can be selectively energized by a driver circuit provided on the control circuit board of the printer.

Figure 3:
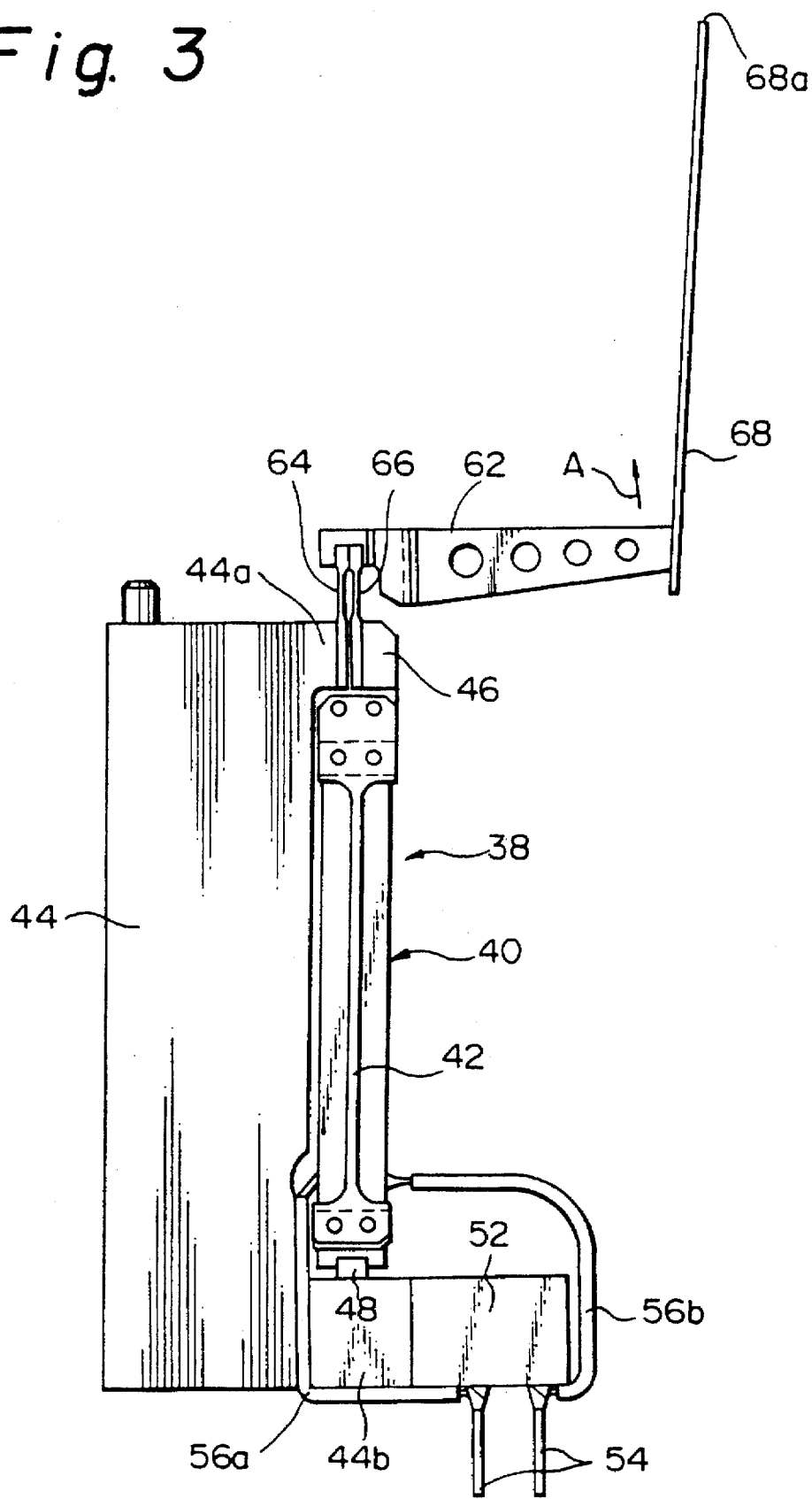
FIG. 3 is an enlarged elevational view of a piezoelectric-type actuator incorporated in the printing head shown in FIG. 2.

As best shown in FIG. 3, the actuator 38 further includes an arm lever 62, an outer end of which is supported by the block member 44 and the piezo stack 40 through the intermediary of two parallel leaf spring elements 64 and 66 securely connected thereto. In particular, the respective ends of the outer leaf spring element 64 are securely joined to the outer end of the arm lever 62 and the front extended-portion 44a of the block member 44, and the respective ends of the inner leaf spring element 66 are securely joined to the outer end of the arm lever 62 and the block piece 46 of the piezo stack 40. The arm lever 62 is provided with a printing wire element 68 securely attached to the inner end thereof, as shown in FIG. 3, and the wire element 68 is extended through the disk-like plate 30 and the nose member 32 such that a free end 68a of the wire element 68 projects from a front face 26a of the nose member 26, as shown in FIG. 2.

When the piezo stack 40 is electrically energized such that the height or length thereof is increased, the arm lever 62 is rotated in a direction indicated by an arrow A (FIG. 3) about a middle point of a span length of the outer leaf spring element 64, extended between the outer end of the arm lever 62 and the front extended-portion 44a of the block member 44, and thus the printing wire 68 can be driven forwardly for marking a dot. After the energizing of the piezo stack 40 is ended, the printing wire element 68 executes a rearward stroke due to the resilient force of the leaf spring elements 64 and 66, and is then returned to an initial position as shown in FIG. 3. With the arrangement as mentioned above, although the increment of the height or length of the piezo stack 40 is very small (about 10 μm), it can be amplified by the arm lever 62 so that the printing wire element can execute the forward stroke of several hundreds of microns necessary to mark the dot.

Note, the free ends 68a of the twenty four wire elements 68 are arranged at the front face 32a of the nose member 32 in two parallel columns at a given pitch, and the free ends 68a included in one of the two columns are shifted by one-half of said pitch with respect to the free ends 68a included in the other column. Namely, the one-half of the pitch represents a dot pitch at which a dot-image printing is carried out by the printing head 10.

Figure 4:
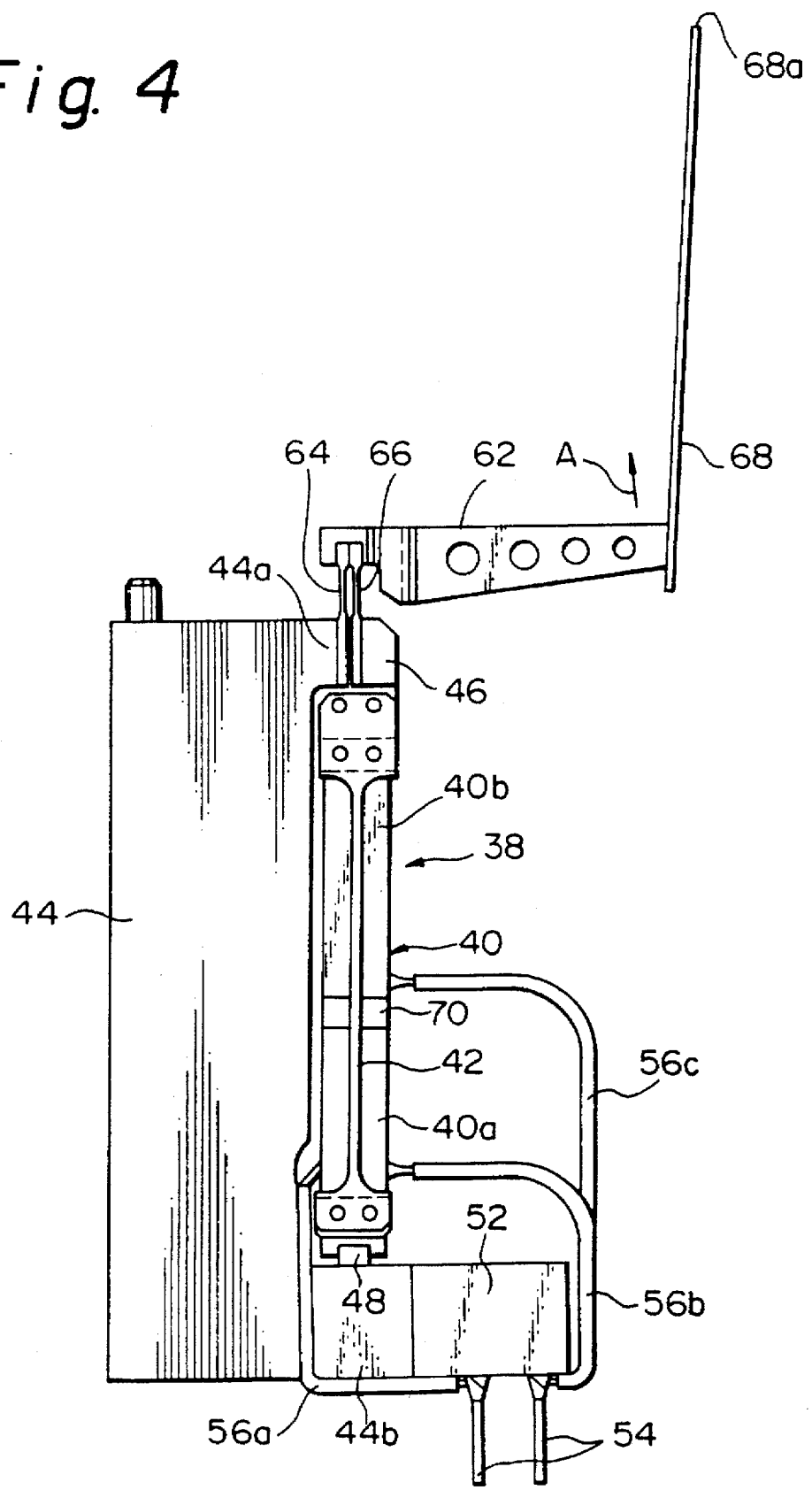
FIG. 4 is a view similar to FIG. 3, showing a piezoelectric-type actuator constituted in accordance with a first aspect of the present invention.
Figure 5:
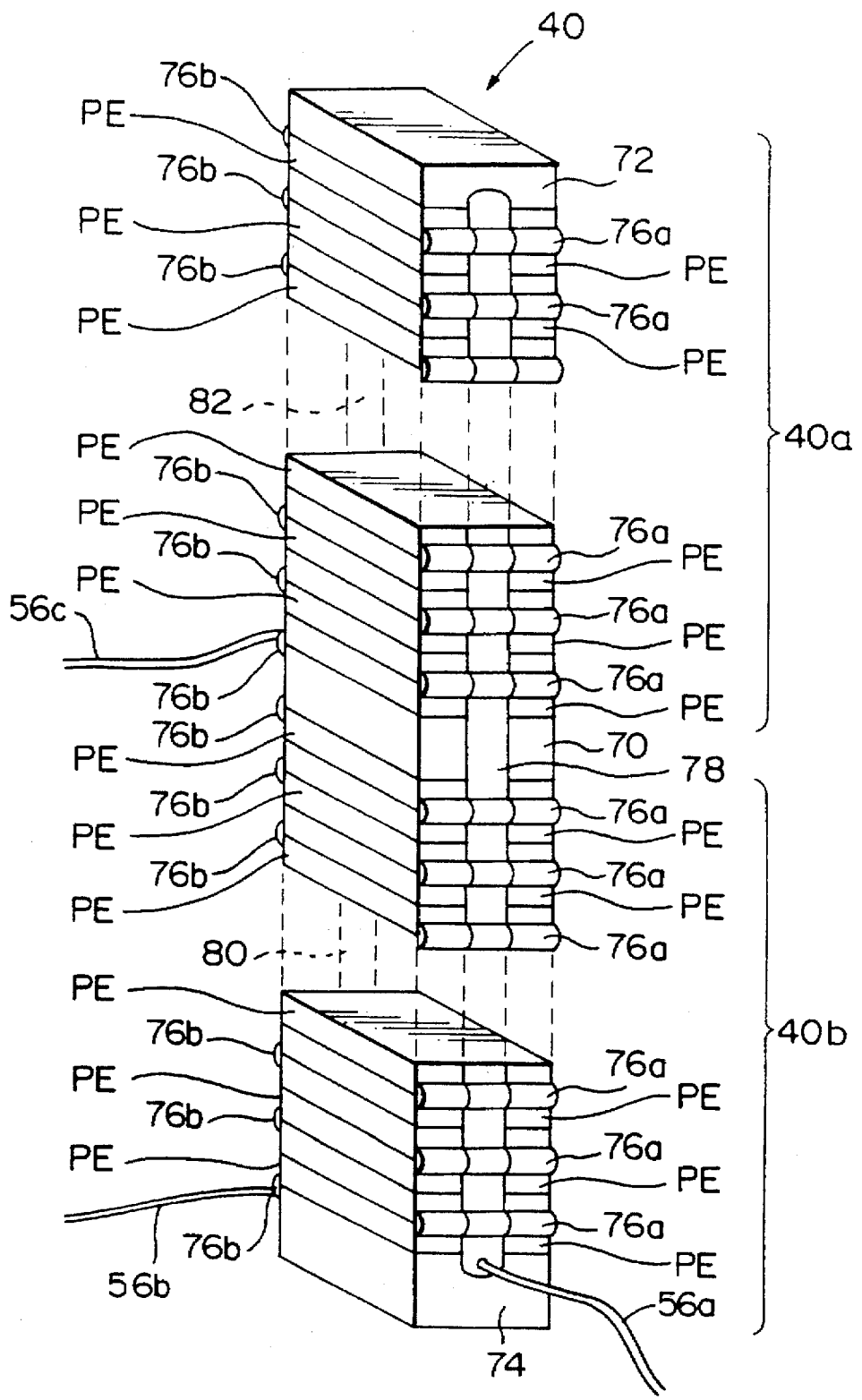
FIG. 5 is a perspective view showing a piezo stack forming a part of the piezoelectric-type actuator shown in FIG. 4.

A first aspect of the present invention is directed to increasing the printing speed of the piezoelectric-type printing head, as mentioned above, without damaging a recording medium such as a sheet of paper. According to the first aspect of the present invention, as shown in FIGS. 4 and 5, the piezo stack 40 is divided into two sections 40a and 40b by an inactive element 70 intervened therebetween. The section 40a terminates in an endmost element 72, and includes a plurality of piezo elements PE disposed between the inactive element 70 and the endmost element 72. The section 40a further includes respective electrode layers formed between each two adjacent, successive piezo elements PE, and also two additional electrode layers are formed between the inactive element 70 and the piezo element PE adjacent thereto and between the endmost element 72 and the piezo element PE adjacent thereto, respectively. Similarly, the section 40b terminates in an endmost element 74, and includes a plurality of piezo elements PE disposed between the inactive element 70 and the endmost element 74. The section 40b further includes respective electrode layers formed between each two adjacent, successive piezo elements PE, and also two additional electrode layers are formed between the inactive element 70 and the piezo element PE adjacent thereto and between the endmost element 74 and the piezo element PE adjacent thereto, respectively. As shown in FIG. 5, the piezo stack 40 has a plurality of terminals 76a formed on one of the opposed sides thereof, and a plurality of terminals 76b formed on the other side thereof, and the respective terminals 76a and terminals 76b are alternately connected to the electrode layers to establish an electrical contact therebetween. The terminals 76a are electrically connected to each other by a single conductive layer 78 formed on the corresponding side of the piezo stack 40, and the conductive layer 78 is electrically connected to the electrical lead 56a. The terminals 76b included in the section 40a are electrically connected by a conductive layer 80 formed on the corresponding side of the section 40a, and the conductive layer 80 is electrically connected to the electrical lead 56b. Similarly, the terminals 76b included in the section 40b are electrically connected by a conductive layer 82 formed on the corresponding side of the section 40b, and the conductive layer 82 is electrically connected to an additional electric lead 56c.

Figure 6:
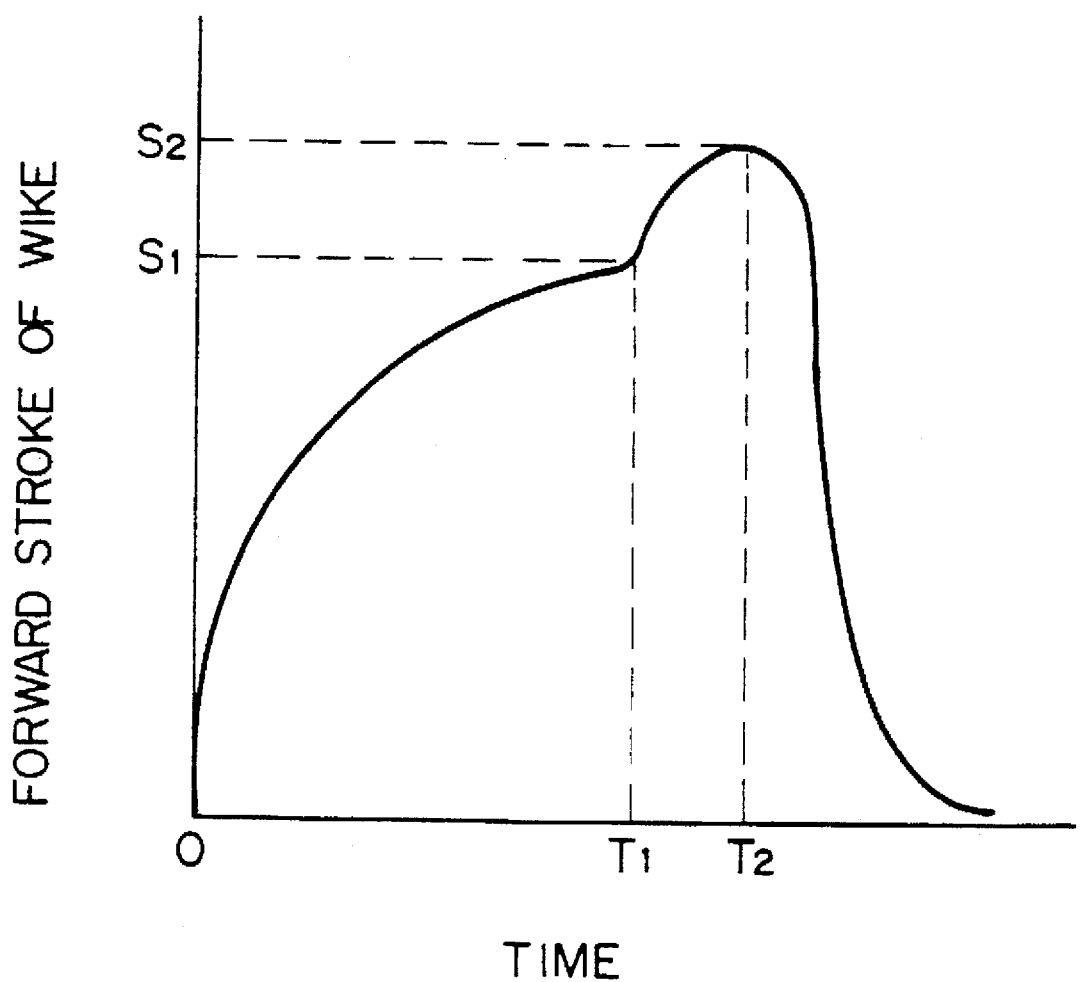
FIG. 6 is a graph showing an operational characteristic of the piezoelectric-type actuator shown in FIG. 4.

In operation, as shown in a graph of FIG. 6, only one of the sections 40a and 40b is electrically energized over a time of $T_1$ so that the printing wire 68 is driven at a normal forward stroke of $S_1$, and then the other of the sections 40a, 40b is electrically energized over a time of $(T_1-T_2)$ so that an increment of $(S_1-S_2)$ is added to the normal forward stroke of $S_1$. Accordingly, it is possible to increase the printing speed of the piezoelectric-type printing head 10. Nevertheless, the electric energy to be first applied to the other of the sections 40a, 40b for obtaining the increment of $(S_1-S_2)$ is very small, and thus the penetration of the printing wire element 68 into the sheet of paper P can be prevented.

Figure 7:
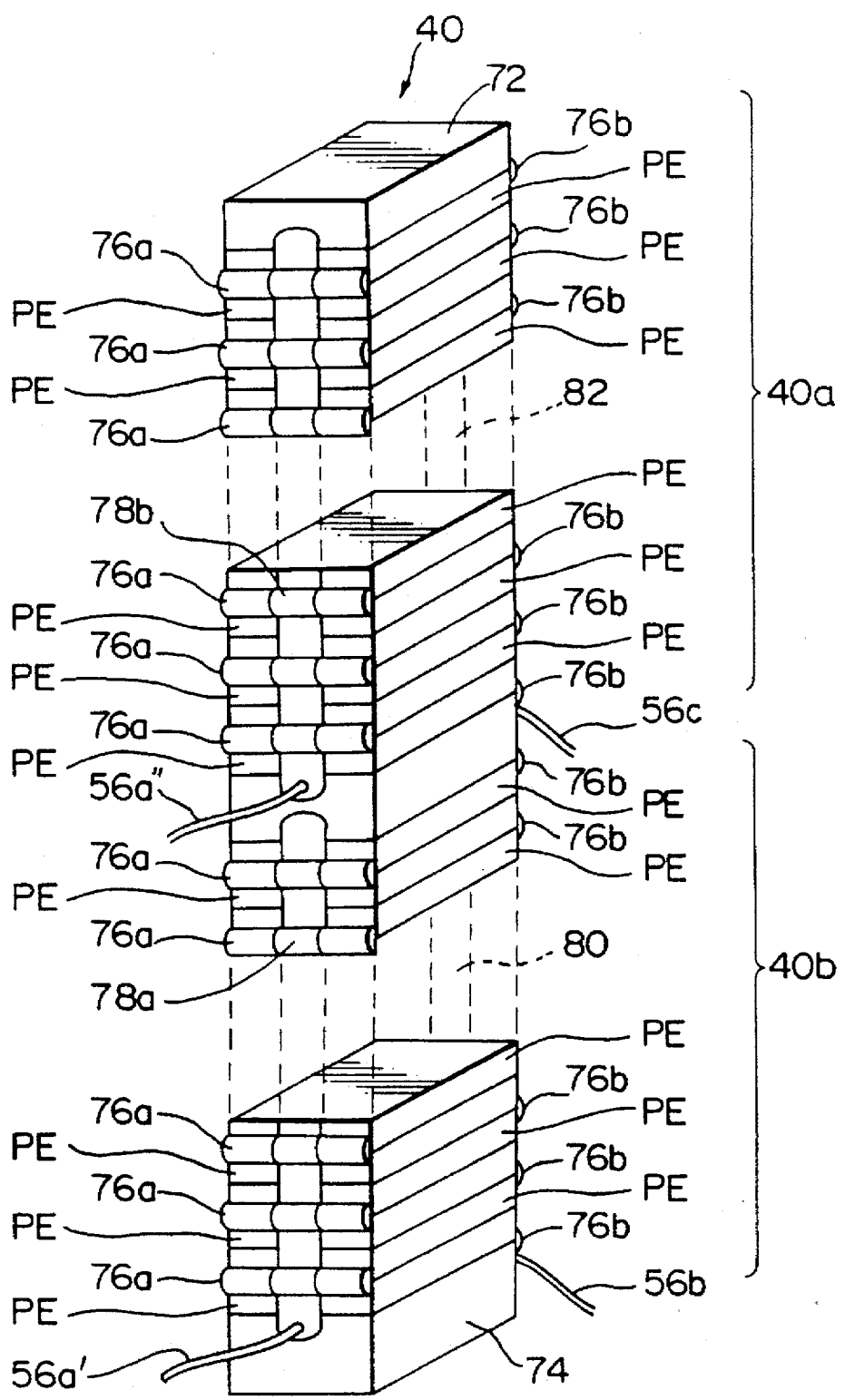
FIG. 7 is a perspective view showing a modification of the piezo stack shown in FIG. 5.

FIG. 7 shows a modification of the piezo stack 40 as shown in FIG. 5. This modified embodiment is identical to that of FIG. 5 except that the terminals 76a included in the section 40a are electrically connected to each other by a conductive layer 78a formed on the corresponding side of the piezo stack 40, and that the terminals 76a included in the section 40b are electrically connected to each other by a conductive layer 78b formed on the corresponding side of the piezo stack 40. Note, the conductive layers 78a and 78b are electrically connected to electric leads 56a' and 56a", respectively.

Figure 8:
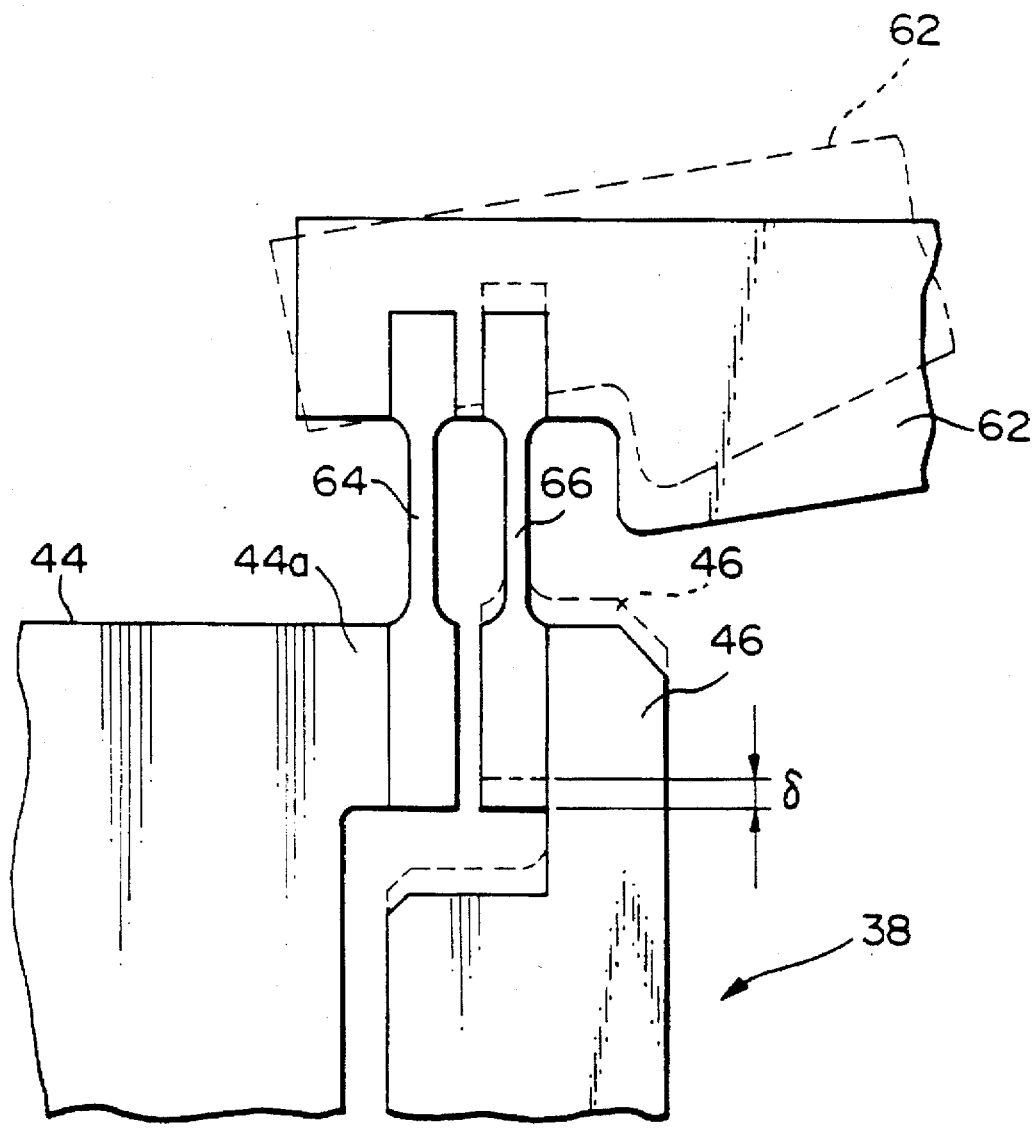
FIG. 8 is a schematic view showing a part of a conventional piezoelectric-type actuator.
Figure 9:
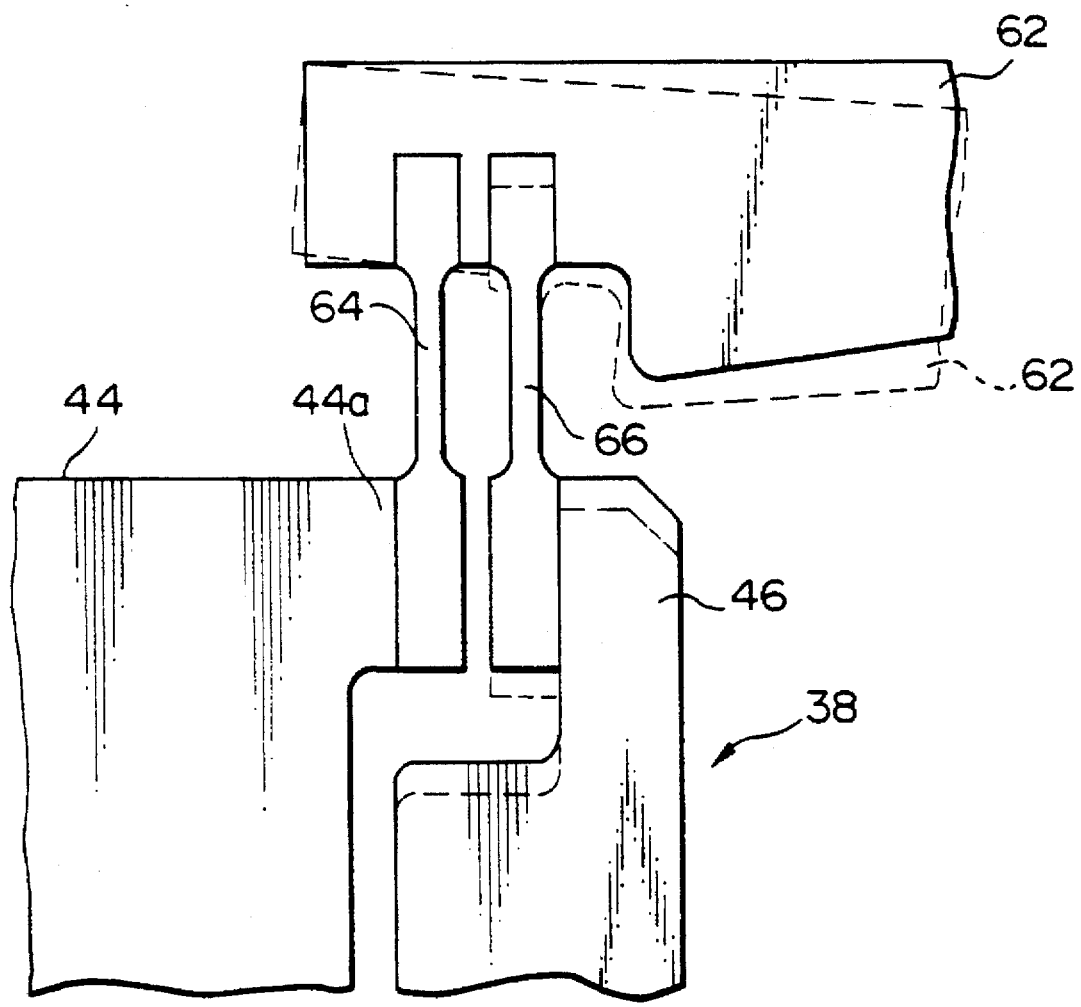
FIG. 9 is a schematic view similar to FIG. 8, showing the conventional piezoelectric-type actuator of FIG. 8 in a different operational stage.

As discussed hereinbefore, to achieve a further increase in printing speed by the piezoelectric-type actuator 38 as shown in FIG. 3, the piezo stack 40 must be electrically energized by a larger (i.e., greater amount of) electrical energy so that the forward stroke of the printing wire element 38 must be slightly larger. Namely, an increment of height or length of the piezo stack 40, as indicated by δ in FIG. 8, must be somewhat larger in comparison with the case where the printing is made at a normal printing speed. Of course, in this case, the rotational movement of the arm lever 62 from the initial position thereof (shown by a solid line in FIG. 8) to the rotated position thereof (shown by a broken line in FIG. 8) is also larger in comparison with the case of the normal printing speed. Accordingly, when the electrical energizing of the piezo stack 40 is ended, the rearward (i.e., return) stroke of the printing wire element 62 becomes larger so that the printing wire element 62 is moved rearwardly (i.e., to a retracted, or return position) beyond the initial position. Thus, the arm lever 62 also is moved rearwardly beyond the intial position, as shown by a broken line in FIG. 9. In this case, the leaf spring element 64, extended between the arm lever 62 and the front extended-portion 44a of the block member 44, is subjected to a tensile stress, whereas the leaf spring element 66, extended between the arm lever 62 and the block piece 46 of the piezo stack 40, is subjected to a compressive stress. A leaf spring exhibits a strong durability against tensile stress, but it is can easily be broken by compressive stress. Accordingly, the leaf spring element 66 can be prematurely broken.

Figure 10:
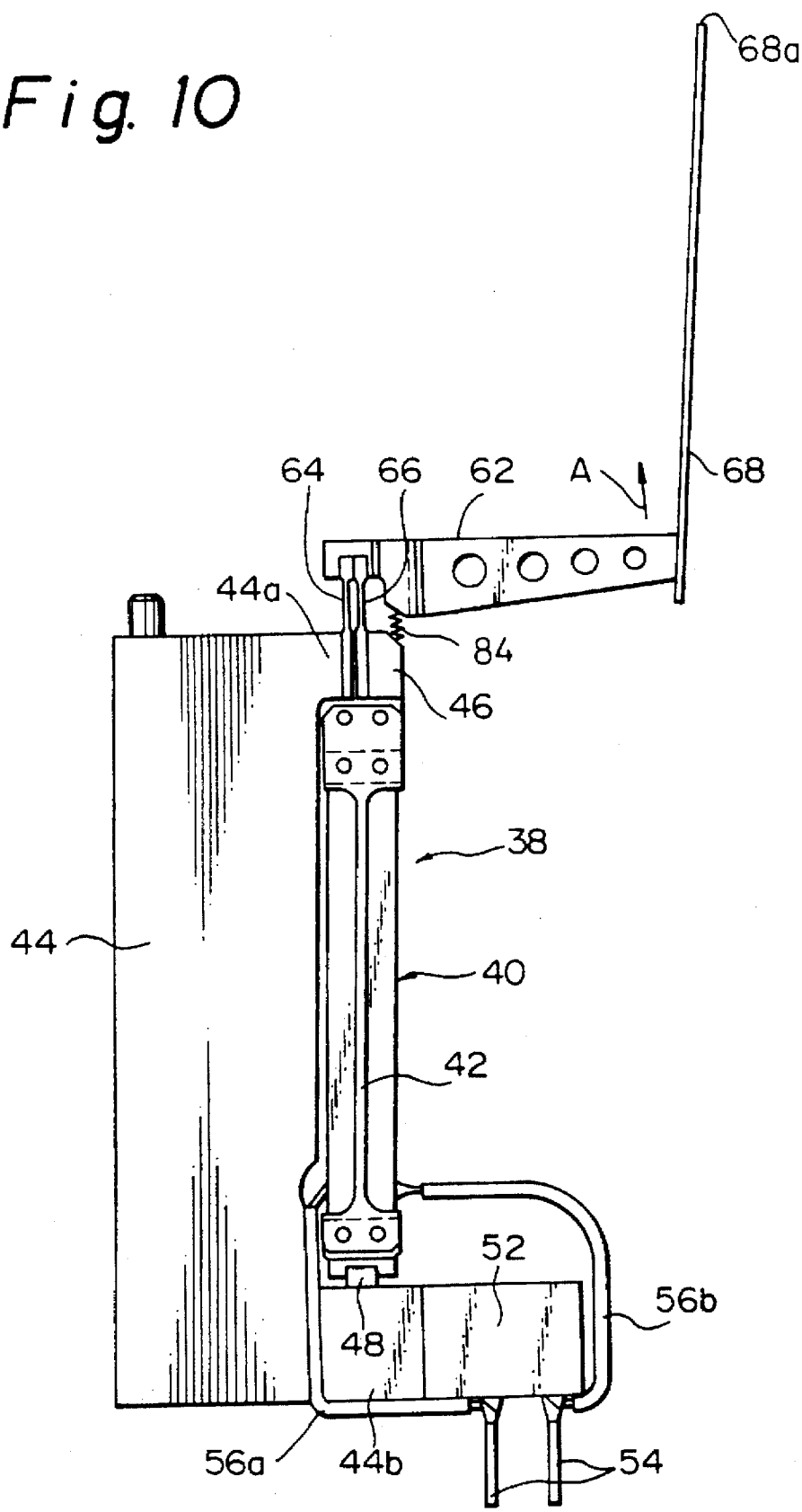
FIG. 10 is an elevational view showing a piezoelectric-type actuator constituted in accordance with an second aspect of the present invention.

A second aspect of the present invention is directed to a further increase in printing speed in the piezoelectric-type printing head without any premature breakage of a drive mechanism thereof. According to the second aspect of the present invention, the piezoelectric-type actuator includes a resilient regulation means for resiliently regulating the rearward stroke of the printing wire element 68. In an embodiment as shown in FIG. 10, the resilient regulation means comprises a coil spring element 84 provided in a space between the block piece 46 of the piezo stack 40 and the arm lever 62 and placed at an inner location with respect to the leaf spring element 66, and the ends of the coil spring element 84 are securely joined to the block piece 46 and the arm lever 62, respectively. With this arrangement, the rearward movement of the arm lever 62 is resiliently regulated and braked by the coil spring 84 during the the rearward stroke of the printing wire element 68, whereby the premature breakage of the leaf spring element 66 can be prevented. Also, the oscillation of the arm lever 62 can be immediately dampened, whereby the printing wire element 68 can be quickly returned to the initial position.

Figure 11:
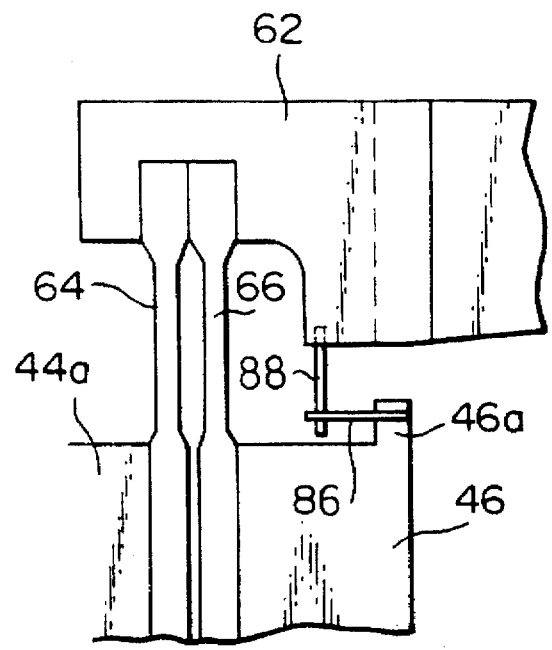
FIGS. 11 through 20 are schematic partial views showing various modifications of the piezoelectric-type actuator shown in FIG. 10.
Figure 12:
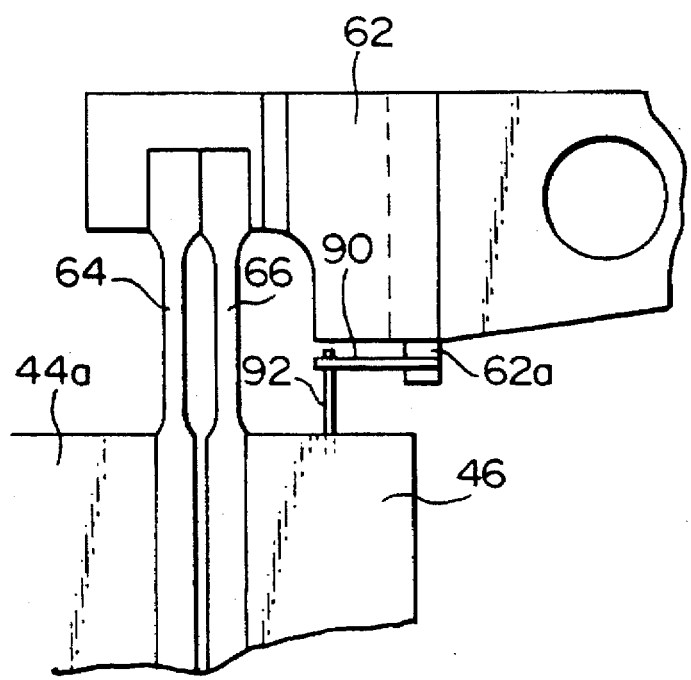
Figure 13:
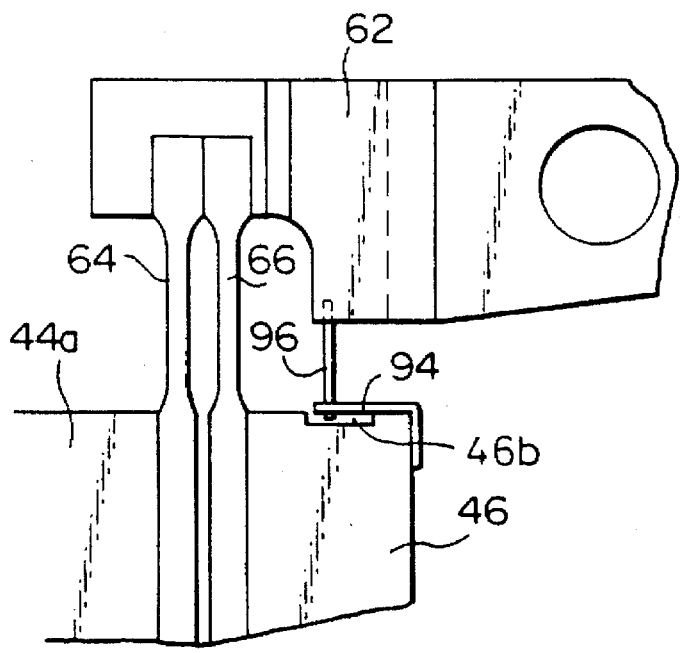

In another embodiment as shown in FIG. 11, the resilient regulation means comprises a leaf spring element 86 supported by a protruded portion 46a of the block piece 46 in a cantilever manner, and a wire element 88 projected from the arm lever 62 and securely connected to the free end of the leaf spring element 86. In yet another embodiment as shown in FIG. 12, the resilient regulation means comprises a leaf spring element 90 supported by a protruded portion 62a of the arm lever 62 in a cantilever manner, and a wire element 92 projected from the block piece 46 and securely connected to the free end of the leaf spring element 90. In yet another embodiment as shown in FIG. 13, the resilient regulation means comprises a L-shaped leaf spring element 94 securely fitted to a corner of the block piece 46, and a wire element 96 projected from the arm lever 62 and securely connected to the free end of the L-shaped leaf spring element 94. As shown in FIG. 13, the block piece 46 has a recess 46b formed in the front face thereof, and the free end of the wire element 96, which is penetrated through the leaf spring element 94, is received in the recess 46b.

Figure 14:
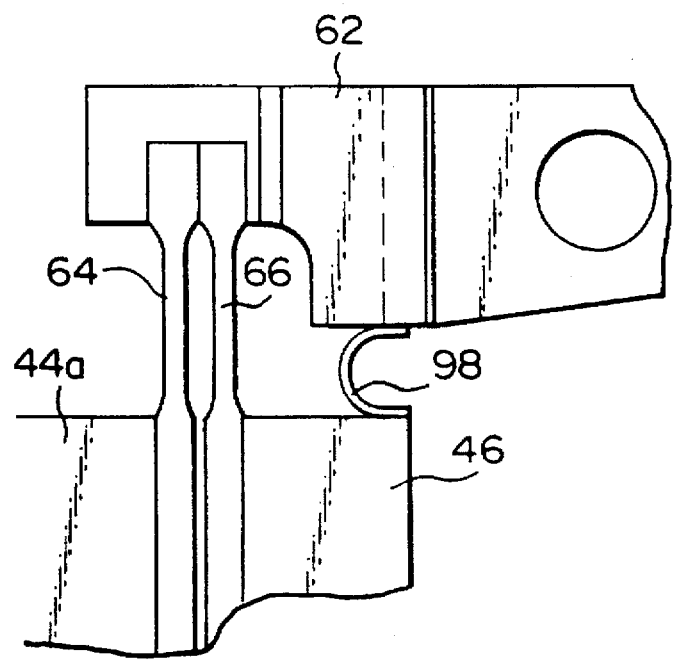
Figure 15:
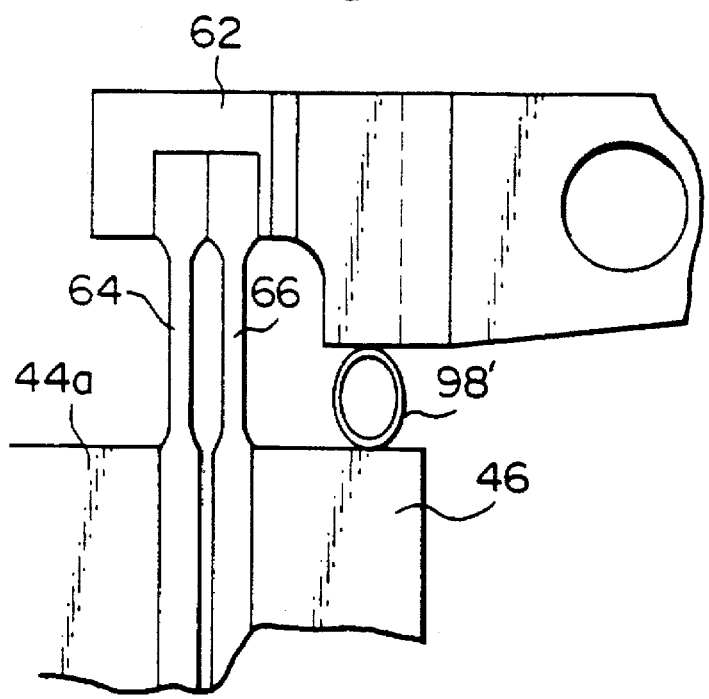
Figure 16:
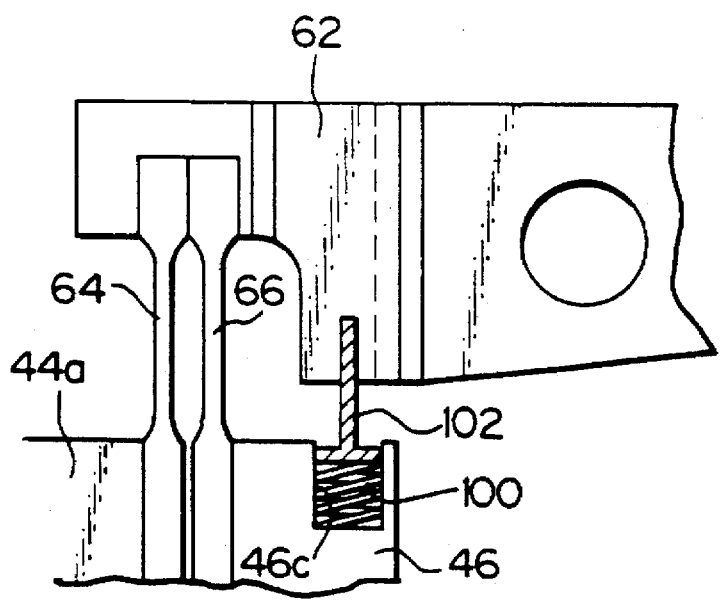

Furthermore, in yet another embodiment as shown in FIG. 14, the resilient regulation means comprises a generally U-shaped leaf spring element 98 provided between and securely joined to the block piece 46 and the arm lever 62, respectively. Alternatively, as shown in FIG. 15, an oval leaf spring element 98' may be substituted for the U-shaped leaf spring element 98. Also, in yet another embodiment as shown in FIG. 16, the resilient regulation means comprises a coil spring element 100 received in a bore 46c formed in the block piece 46, and a pin element (i.e., a plunger) 102 projected from the arm lever 62 and connected to the coil spring element 100 through a small flat disc integrally formed at the free end thereof.

Figure 17:
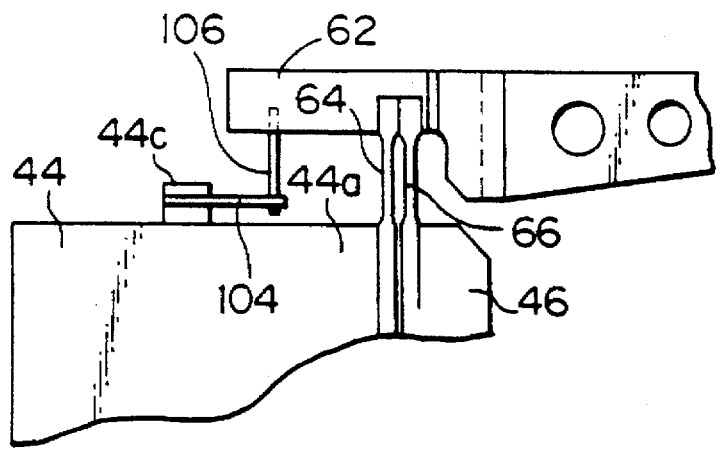

In addition, in yet another embodiment as shown in FIG. 17, the resilient regulation means comprises a leaf spring element 104 supported by a protruded portion 44c of the block member 44 in a cantilever manner, and a wire element 106 projected from the arm lever 62 and securely connected to the free end of the leaf spring element 104. As shown in FIG. 17, although this resilient regulation means is provided between the block member 44 and the outermost end of the arm lever 62, the rearward (i.e., return) movement of the arm lever 62 can be resiliently regulated and braked by the leaf spring 104 during the the rearward stroke of the printing wire element 68, similar to the various embodiments as mentioned above.

Figure 18:
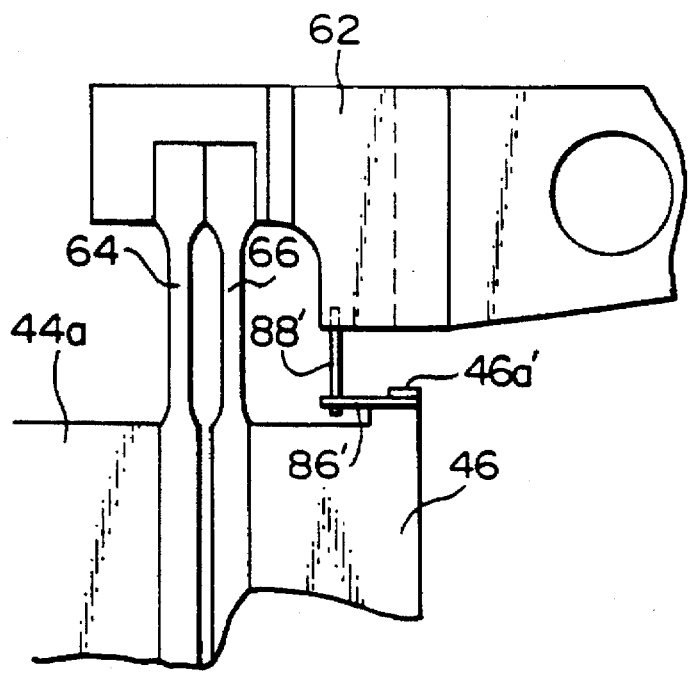

FIG. 18 shows an embodiment which is similar to that of FIG. 11. Namely, the resilient regulation means comprises a leaf spring element 86' supported by a protruded portion 46a' of the block piece 46 in a cantilever manner, and a wire element 88' projected from the arm lever 62 and securely connected to the free end of the leaf spring element 86'. Nevertheless, this embodiment is characterized in that a step is made on the protruded portion 46a' as shown in FIG. 18, such that the rearward (i.e., return) movement of the arm lever 62 can be more strongly regulated and braked due to the step of the protruded portion 46a'. In particular, the step of the protruded portion 46a' allows the leaf spring element 86' a longer flexible span in the foward (i.e., advancing) movement of the arm lever 62, but the flexible span of the leaf spring element 86' allowed by the step of the protruded portion 46a' is shorter in the rearward (i.e., return) movement of the arm lever 62.

Figure 19:
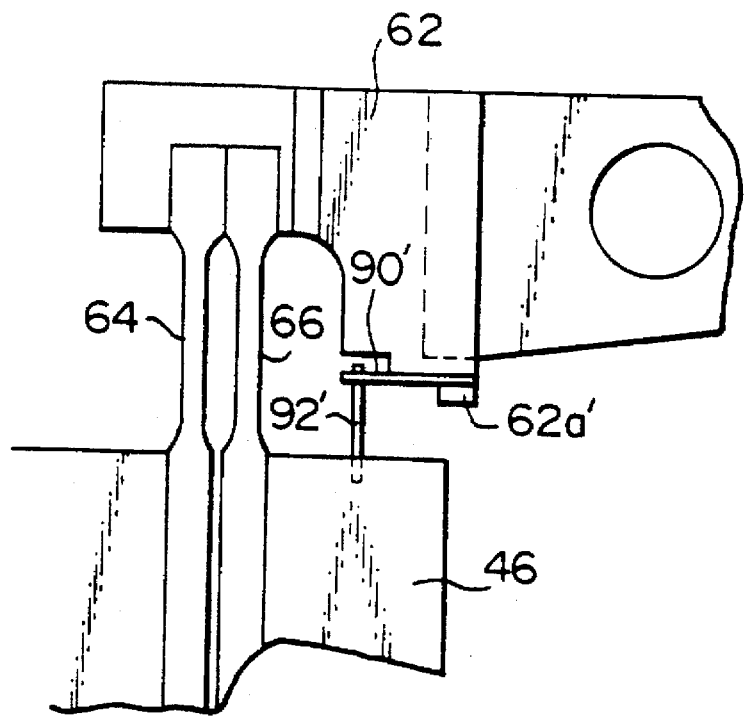

FIG. 19 shows an embodiment which is similar to that of FIG. 12. Namely, the resilient regulation means comprises a leaf spring element 90' supported by a protruded portion 62a' of the arm lever 62 in a cantilever manner, and a wire element 92' projected from the block piece 46 and securely connected to the free end of the leaf spring element 90'. Similar to the embodiment of FIG. 18, this embodiment is characterized in that a step is made on the protruded portion 62a' as shown in FIG. 19, such that the rearward (i.e., return) movement of the arm lever 62 can be more strongly regulated and braked due to the step of the protruded portion 62a'.

Figure 20:
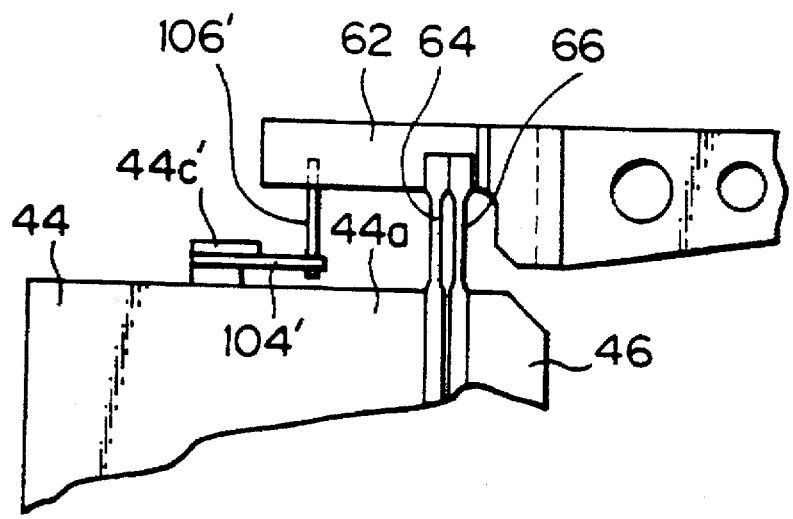
Figure 21:
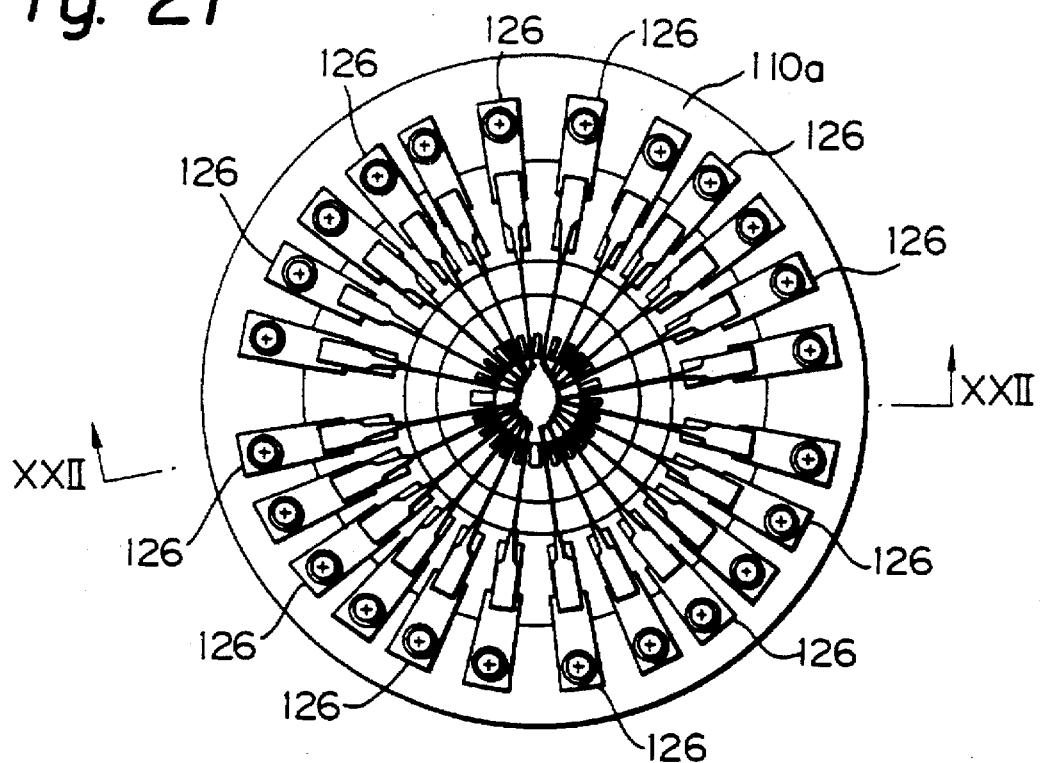
FIG. 21 is a plan view showing a wire-dot printing head having another type of piezoelectric-type actuator constituted in accordance with the second aspect of the present invention.
Figure 22:
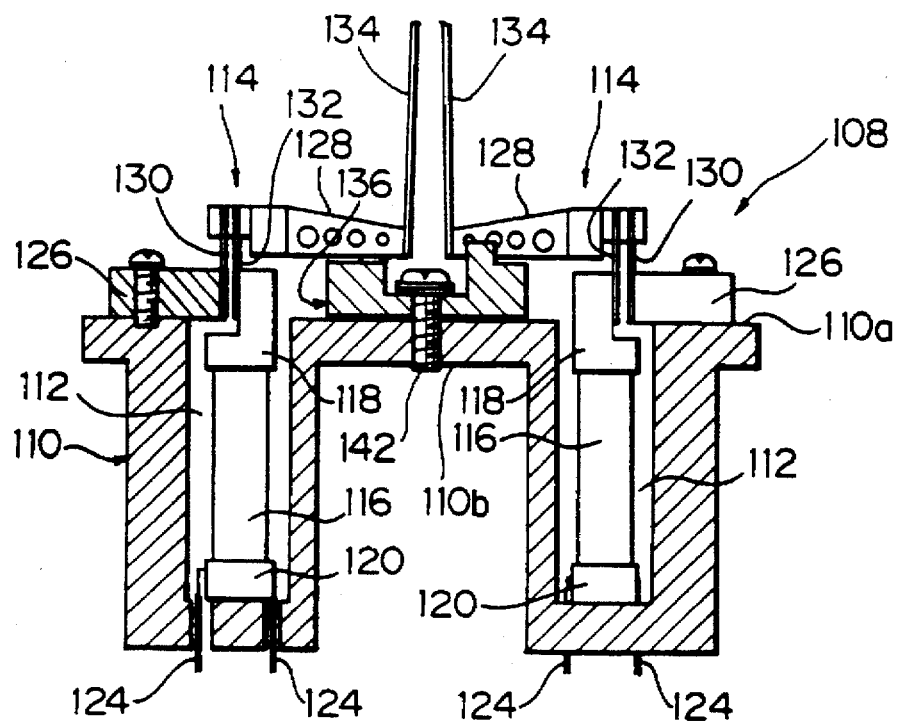
FIG. 22 is a cross-sectional view taken in a plane along a line XXII—XXII in FIG. 21.

FIG. 20 shows an embodiment which is similar to that of FIG. 17. Namely, the resilient regulation means comprises a leaf spring element 104' supported by a protruded portion 44c' of the block member 44 in a cantilever manner, and a wire element 106' projected from the arm lever 62 and securely connected to the free end of the leaf spring element 104'. Similar to the embodiment of FIG. 18, this embodiment is characterized in that a step is made on the protruded portion 44c', as shown in FIG. 20, such that the rearward (i.e., return) movement of the arm lever 62 can be more strongly regulated and braked due to the step of the protruded portion 44c'.

FIGS. 21 to 24 show another embodiment of a piezoelectric-type printing head constituted in accordance with the second aspect of the present invention. This piezoelectric-type printing head, generally indicated by reference 108, comprises a double-walled annular member 110 having an annular hollow space 112 formed therein, and twenty-four piezoelectric-type actuators 114 annularly arranged within the hollow space 112. Each of the actuators 114 includes a piezo stack 116 constructed in substantially the same manner as the above-mentioned piezo stack 40, and the piezo stack 116 has a block piece 118 securely attached to a front end thereof, and a base block piece 120 securely attached to a rear end thereof. The base block piece 120 of the piezo stack 116 is securely mounted on a bottom of the annular member 110, and has a pair of leads 124 for electrically energizing the piezo stack 116. The leads 124 are extended out of holes formed in the bottom of the annular member 110 to be connected to a driver circuit provided on a control circuit board of a printer. As is apparent from FIGS. 21 and 22, twenty four block pieces 126 are annularly arranged along an front annular flange 110a of the annular member 110 so as to be adjacent to the block pieces 118 of the piezo stacks 112, respectively, and each of the block pieces 126 is securely attached to the front annular flange of the annular member 110. Each of the piezoelectric-type actuators 114 further includes an arm lever 128, an outer end of which is supported by the adjacent block pieces 118 and 126 through the intermediary of two parallel leaf spring elements 130 and 132, and an inner end of which is provided with a printing wire element 134 securely attached thereto. The arrangement as mentioned above is substantially identical to that of FIGS. 2 and 3, and thus the printing wire elements 134 are driven in substantially the same manner as the above-mentioned printing wire elements 68.

Figure 23:
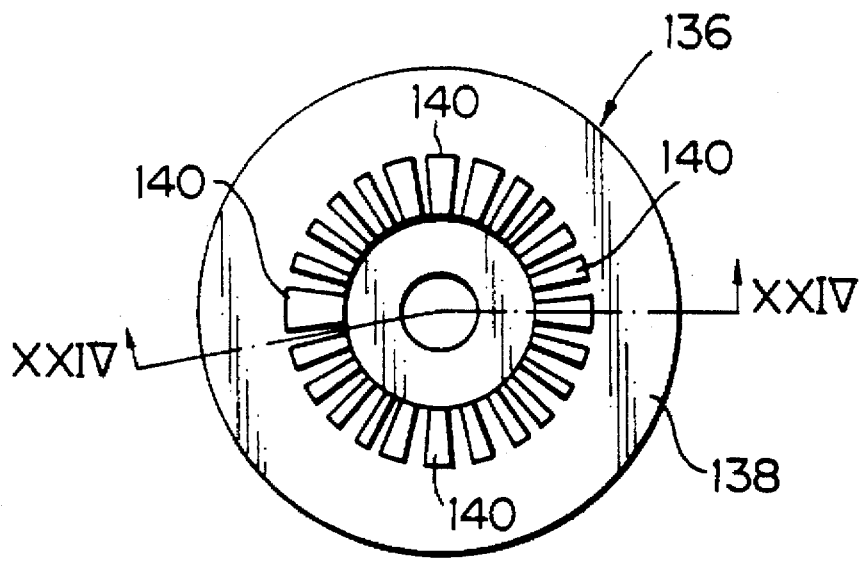
FIG. 23 is a plan view of an annular stopper member incorporated in the printing head shown in FIG. 21.
Figure 24:
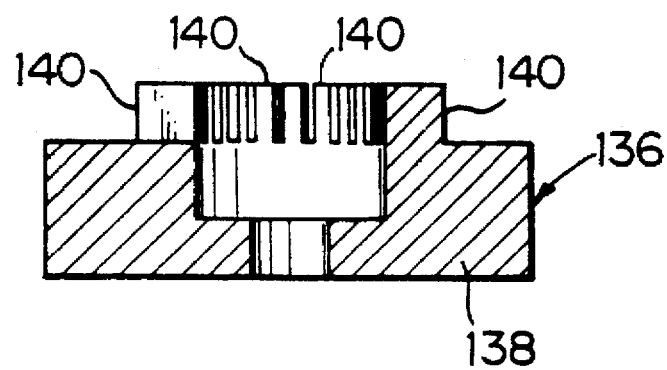
FIG. 24 is a cross-sectional view taken in a plane along a line XXIV—XXIV in FIG. 23.

In this embodiment, a stopper member 136 is incorporated in the printing head 108 such that the printing wire element 134 is forcibly stopped at the initial position during the rearward (i.e., return) stroke thereof, whereby the printing wire element 134 cannot be moved rearwardly beyond the initial position thereof. In particular, the stopper member 136 is annularly shaped, as shown in FIGS. 23 and 24, and has an annular base portion 138, and twenty four sector-shaped protrusions 140 integrally projected from the base portion 138 and arranged along an annular inner edge thereof to define a radial slot between the adjacent two protrusions 140. As best in shown FIG. 22, the stopper member 136 is securely mounted on a circular central portion 110b of the annular member 112 by a screw 142 such that the arm levers 128 are received in the radial slots of the stopper member 136. The base portion 138 of the stopper member 136 is sized such that each of the arm levers 128 rests on a front face of the base portion 138 at the initial position thereof. Namely, the front face of the base portion 138 serves as a stopper face for the arm levers 128. Accordingly, the arm levers 128 cannot be moved rearwardly beyond the initial position thereof during the rearward stroke of the printing wire element 134.

Figure 25:
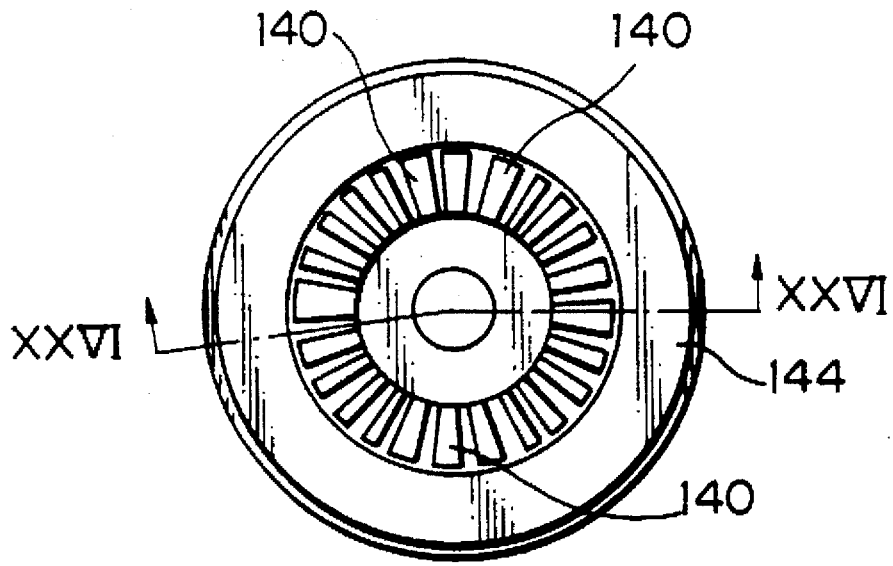
FIG. 25 is a view similar to FIG. 23, in which the annular stopper member of FIG. 23 has a flexible sheet applied to a stopper face thereof.
Figure 26:
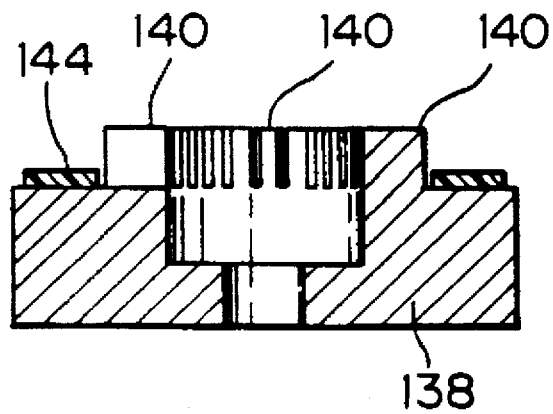
FIG. 26 is a cross-sectional view taken in a plane along a line XXVI—XXVI in FIG. 25.
Figure 27:
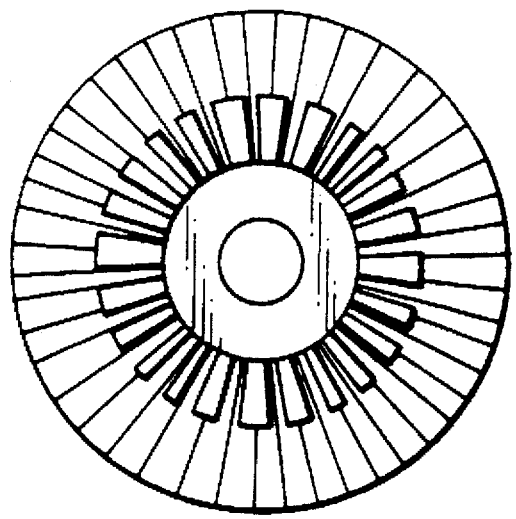
FIG. 27 is a view similar to FIG. 25, showing a modification of the annular stopper member of FIG. 25.
Figure 28:
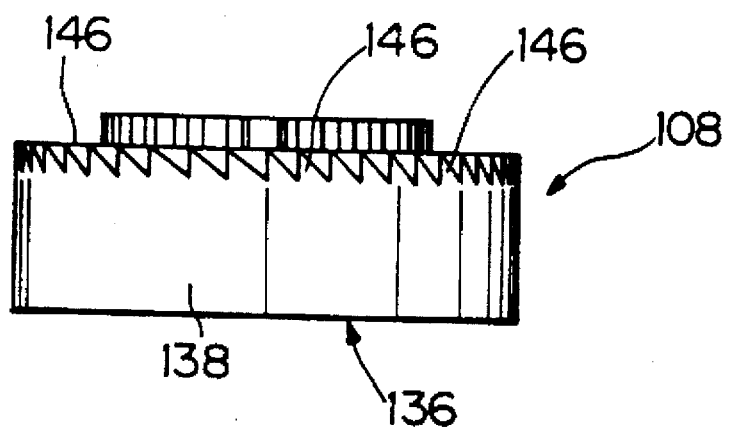
FIG. 28 is an elevational view of FIG. 27.

As shown in FIGS. 25 and 26, the stopper face of the base portion 138 may be covered by an annular flexible sheet 144 so that it can be protected from wear. The flexible sheet 144 is preferably formed of a polyimide resin exhibiting a wear-resistant property. When the stopper face of the base portion 138 is covered by the flexible sheet 144, a plurality of radial teeth may be formed on the stopper face of the base portion 138, as shown in FIGS. 27 and 28. When the flexible sheet 144 is hit by the arm levers 128 during the operation of the printing head 108, the annular flexible sheet 144 is subjected to a rotational force due to the toothed face of the base portion 138. Namely, the flexible sheet 144 is rotated on the toothed face of the base portion 138, as to prevent it from being locally worn.

Figure 29A:
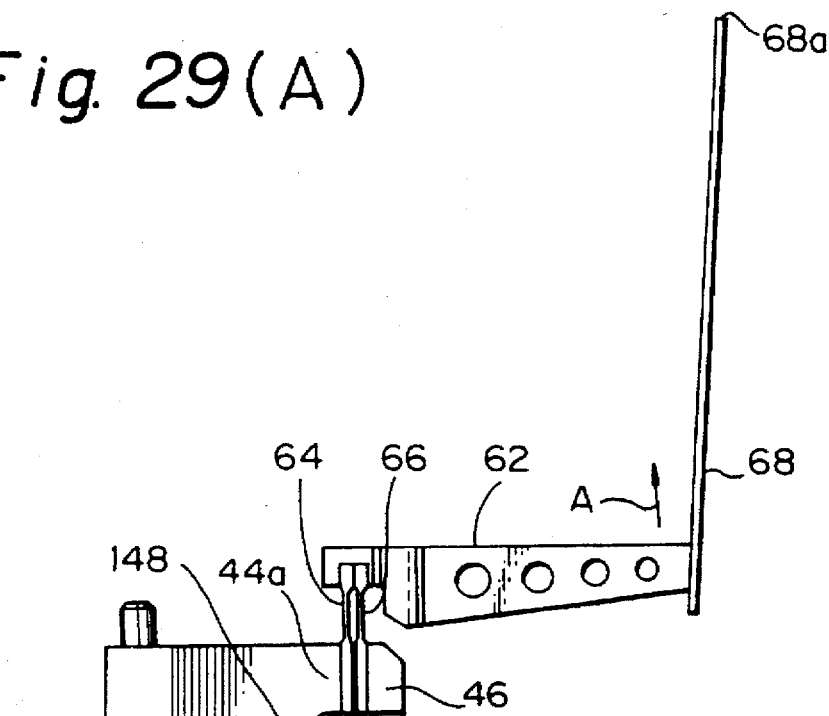
FIG. 29 (A) is an elevational view showing a piezoelectric-type actuator constituted in accordance with a third aspect of the present invention.
Figure 29B:
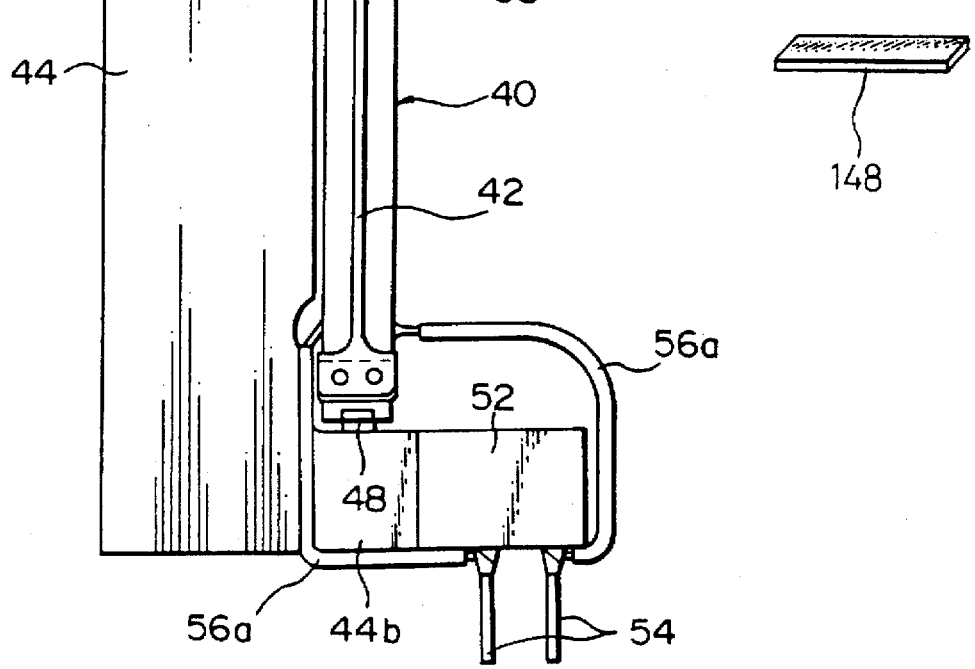

A third aspect of the present invention is directed to a positive support of the piezo stack by the block member without being subjected to a large load. FIG. 29(A) shows a piezoelectric-type actuator which is identical to that of FIG. 3 except that the piezo stack 40 is supported by the block member 44 through the intermediary of a leaf spring element 148 as shown in FIG. 29(B). The block member 44 has a recess formed therein adjacent to the front extended-portion 44a thereof, and a slot is formed in the bottom of said recess for receiving an end of the leaf spring 148. The piezo stack 40 has a slot formed at the front end thereof, and the slot is aligned with the slot formed in the block member 44 for receiving the other end of the leaf spring 148. Each of the ends of the leaf spring 148 is securely fixed in the corresponding slot by, for example, brazing.

Figure 30A:
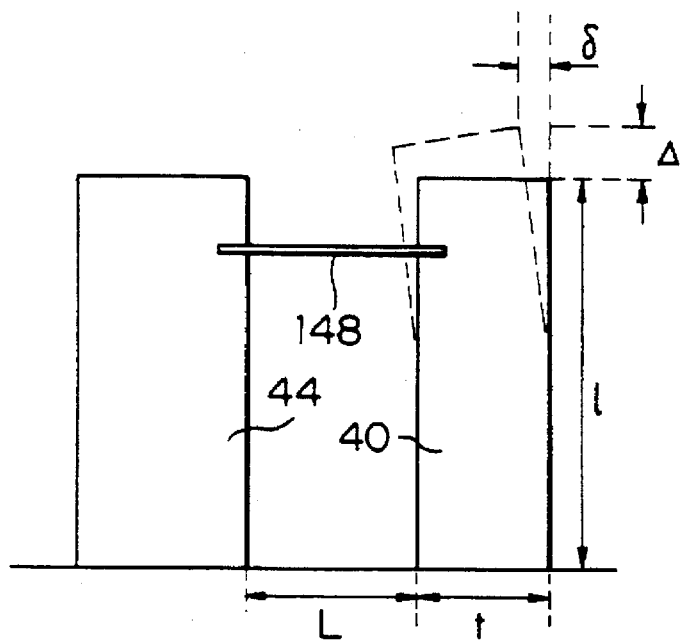
FIG. 30(A) is a model of the piezoelectric-type actuator of FIG. 29 for calculating a bending stress generated in a piezo stack thereof.

When the piezo stack 40 is electrically energized, a bending stress is generated in the piezo stack 148, and can be calculated by a model shown in FIG. 30(A). As stated hereinbefore, in U.S. Pat. No. 4,874,978, the piezo stack is supported by a block member through the intermediary of a parallelogram link member securely attached to the piezo stack and the block member. Of course, in this case, a bending stress is generated in the piezo stack during an electrical energizing thereof, and can be calculated by a model shown in FIG. 30(B).

Figure 30B:
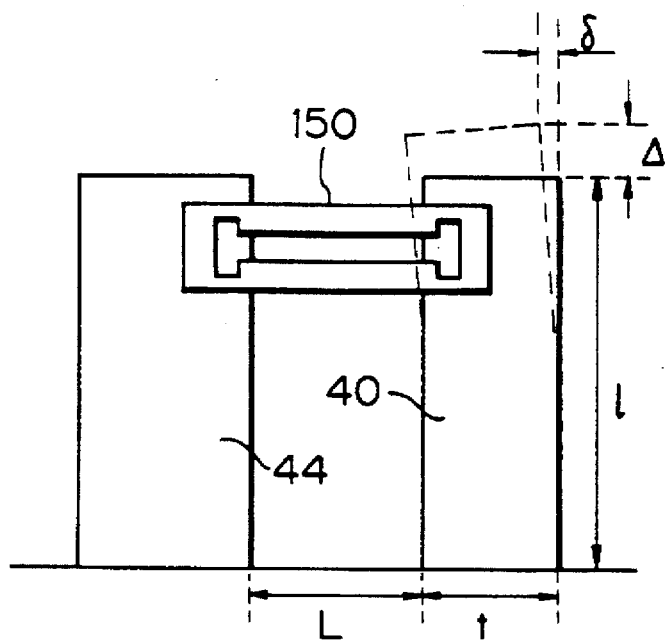
FIG. 30(B) is a model of an conventional piezoelectric-type actuator for calculating a bending stress generated in a piezo stack thereof.

In the model shown in FIGS. 30(A), the piezo stack 40 is supported by the block member 44 through the leaf spring element 148, as shown in FIG. 29, and, in the model shown in FIG. 30(B), the piezo stack 40 is supported by the block member 44 through the parallelogram link member 150, as disclosed in U.S. Pat. No. 4,874,978. In both the models, L indicates a distance between the piezo stack 40 and the block member 44; t indicates a width of the piezo stack 40; and l indicates a height of the piezo stack. Also, $\Delta$ indicates an increment of height or length of the piezo stack 40; and $\delta$ indicates a displacement of the piezo stack toward the block member 44.

In the model shown in FIG. 30(B), when the piezo stack 40 is electrically energized, a bending stress $\sigma_B$ generated at the root of the piezo stack 40 can be calculated as follows:

$$\sigma_B = 3Et\delta/l^2 = 3Et/2l^2 \cdot \Delta^2/L$$

$$\delta = \Delta^2/2L$$

wherein E indicates Young's modulus.

Similarly, in the model shown in FIG. 30(A), when the piezo stack 40 is electrically energized, a bending stress $\sigma_A$ generated at the root of the piezo stack 40 can be calculated as follows:

$$\sigma_A = 9Et/16l^2 \cdot \Delta^2/L$$

$$\delta = 3\Delta^2/4L$$

Accordingly, $$\sigma_A = \tfrac{3}{8} \cdot \sigma_B$$

This proves that the bending stress can be made remarkably small according to the present invention.

Finally, it will be understood by those skilled in the art that the foregoing description is of preferred embodiments of the present invention, and that various changes and modifications can be made without departing from the spirit and scope thereof.

We claim:

1. A printing head for a wire-dot printer, comprising:

a plurality of electromechanical actuators, each mounted on a corresponding support member and respectively associated with a corresponding one of a plurality of lever arms supporting and driving a plurality of respective printing wire elements, each electromechanical actuator being selectively operable in response to electrical energization to be driven from an initial position and to an actuated position and correspondingly driving said respectively associated lever arm in an advancing rotation direction and thereby driving the corresponding printing wire element in a substantially linear direction from an initial position to a printing position, the lever arm returning through a return rotation direction and the printing wire element returning from the printing position to the initial position upon deenergization of the electromechanical actuator; and a plurality of resilient regulators respectively associated with said plurality of electromechanical actuators, each resilient regulator individually and resiliently interconnecting said respective lever arm and said corresponding support member, and thereby resiliently and selectively regulating the return rotation of the respectively associated electromechanical actuator and the return of the corresponding printer wire element from the printing position and toward the initial position when said electromechanical actuator is deenergized, each resilient regulator comprising a wire link extending in substantially the same direction as the printing wire element and a leaf spring link affixed to the wire link at one end of the wire link and extending substantially transversely thereto, the resilient regulator have a first resilient span of movement when the lever arm moves in the advancing rotation direction and a second resilient span of movement when the lever arm moves in the return rotation direction, the first resilient span of movement being greater than the second resilient span of movement.

2. A printing head as recited in claim 1, wherein each of said electromechanical actuators comprises a piezoelectric actuator.

3. A printing head as recited in claim 1, wherein said resilient regulator exerts a first force resiliently restricting rotational movement of the lever arm in the advancing rotation direction from the initial and to the actuated, operative position and a second, greater force resiliently resisting movement of the lever arm in the return rotation direction from the actuated, operative position and to the initial position thereof.

4. A printing head as recited in claim 2, wherein each of said electromechanical actuators comprises a piezoelectric actuator.

5. A printing head for a wire-dot printer as recited in claim 1, wherein a second end of the wire link is connected to the lever arm and a second end of the leaf spring link, remote from the wire link, is secured to the corresponding support member.

6. An electromechanical actuator as recited in claim 5, wherein the leaf spring link extends in a direction substantially parallel to the lever arm and the support is secured to the second end of the leaf spring link to permit a greater length of resilient movement of the leaf spring in the advancing rotation direction, and a lesser length of resilient movement of the leaf spring link in the return rotation direction, of the lever arm.

7. An electromechanical actuator, comprising:

a stack of electromechanical elements, the stack being disposed in and having a variable length in a first direction, comprising a first length in a rest condition and a second, increased length in an electrically energized condition of the electromechanical elements;

a support member extending in the first direction, the stack having first and second end portions and the support member having first and second mounting portions, the first end portion of the stack being mounted on the support member at the first mounting portion thereof, the stack extending adjacent to and along the support member, so as to position the second end portion of the stack adjacent to the second mounting portion of the support member;

first and second parallel leaf spring elements respectively having first and second ends, the first end of the first leaf spring being mounted to the second mounting portion of the support member and the first end of the second leaf spring being mounted to the second end portion of the stack;

a lever arm having a first end portion commonly connected to the second ends of the leaf spring elements and extending generally transversely thereof to a second end portion of the lever arm, electrical energization of the stack increasing the stack variable length from the first length to the second length and moving the lever arm in an advancing rotation direction about the second end of the first leaf spring from an initial, rest position and toward an actuated, operative position, the stack returning to the first length when electrically deenergized and the lever arm moving in a return rotation direction from the actuated, operative position to the initial position; and a resilient regulator, connected between the lever arm and a selected one of the stack and the support member, which resiliently regulates the return rotation of the lever arm relatively to the initial position thereof and comprises a wire link extending substantially parallel to the first and second parallel leaf spring elements and a leaf spring link connected at a first end thereof to a first end of the wire link and extending substantially perpendicularly to the first and second parallel leaf spring elements, the resilient regulator have a first resilient span of movement when the lever arm moves in the advancing rotation direction and a second resilient span of movement when the lever arm moves in the return rotation direction, the first resilient span of movement being greater than the second resilient span of movement.

8. An electromechanical actuator as set forth in claim 7, wherein said electromechanical elements comprise piezoelectric elements.

9. An electromechanical actuator as set forth in claim 7, wherein said lever arm has a second end, remote from said first end thereof, further comprising a printing wire element of a wire-dot printing head secured to the lever arm adjacent the second, remote end thereof.

10. An electromechanical actuator as set forth in claim 7, wherein said resilient regulator exerts a first force resiliently restricting movement of the lever arm in the advancing rotation direction from the initial and to the actuated, operative position and a second, greater force resiliently resisting movement of the lever arm in the return rotation direction from the actuated, operative position and to the initial position thereof.

11. An electromechanical actuator as set forth in claim 7, wherein each of said electromechanical elements comprises a piezoelectric element.

12. An electromechanical actuator as set forth in claim 7, wherein said lever arm has a second end, remote from said first end thereof, further comprising a printing wire element of a wire-dot printing head secured to the lever arm adjacent the second, remote end thereof.

13. An electromechanical actuator, comprising:

an electromechanical element comprising a support member and an electromechanical actuator member disposed in parallel, spaced relationship and extending in a first direction, the actuator member having a first length in a rest condition and a second, increased length in an electrically energized condition;

first and second driver elements respectively connected to and extending from the support and electromechanical actuator elements in spaced parallel relationship in the first direction and having corresponding first and second end portions disposed selectively at first and second different relative positions in the first direction corresponding to the rest and electrically energized conditions, respectively, of the actuator member;

a lever arm having a driven end and an actuator end, the driven end engaged pivotally with the first and second end portions of the first and second drive elements, respectively, and the lever arm being supported thereby at a rest position in the rest condition of the actuator member and moved thereby in an advancing rotation direction to an actuated position in response to electrical energization of the actuator member, the rest and actuated positions of the lever arm forming different angular relationships of the lever arm relative to the first direction and corresponding movement of the actuator and thereof between rest and actuated positions; and a resilient regulator comprising a wire link having first and second ends and a leaf spring having a first end connected to the first end thereof and of the wire link, the leaf spring extending from the first end substantially transversely of the wire link to a remote, second end thereof, the resilient regulator interconnecting the lever arm with a selected one of the support and electromechanical actuator elements so as to have a first resilient span of movement when the lever arm moves in the advancing rotation direction to the actuated position thereof and a second resilient span of movement when the lever arm moves in a return rotation direction to the rest position thereof, the first resilient span of movement being greater than the second resilient span of movement.

14. An electromechanical actuator as recited in claim 13, wherein the second end of the wire link is connected to the lever arm and the second end of the leaf spring link is secured to the support member.

15. An electromechanical actuator as recited in claim 14, wherein the first and second driver elements and the second end of the wire link are connected to the driven end of the lever arm at respective first, second and third respective positions of the driven end, successively displaced along the driven end of the lever arm in a direction toward the actuator end thereof.

16. An electromechanical actuator as recited in claim 13, wherein the second end of the wire link is connected to the lever arm and the second end of the leaf spring link is connected to the actuator member.

17. An electromechanical actuator as recited in claim 16, wherein the second end of the wire link and the first and second driver elements are connected to the driven end of the lever arm at respective, first, second and third positions of the driven end, successively displaced along the driven end of the lever arm, in a direction toward the actuator end thereof.

18. An electromechanical actuator as recited in claim 13, wherein the first angular relationship of the lever arm is substantially transverse to the first direction.

19. A printing head as recited in claim 13, wherein said resilient regulator exerts a first force resiliently restricting rotational movement of the lever arm in the advancing rotation direction from the initial and to the actuated, operative position and a second, greater force resiliently resisting movement of the lever arm in the return rotation direction from the actuated, operative position and to the initial position thereof.

20. A printing head for a wire-dot printer comprising:

a plurality of printing elements;

a plurality of electromechanical actuators mounted on a common support member and respectively associated with the plurality of printing wire elements, each electromechanical actuator being selectively operable in response to electrical energization to be driven from a rest position and to an actuated position and correspondingly driving said respectively associated printing wire element from an initial position to a printing position and returning from the printing position to the initial position upon deenergization of the electromechanical actuator;

a common stopper associated with said electromechanical actuators and mounted on said support member and positioned relatively to said plurality of electromechanical actuators for stopping said mechanical actuators at the respective, initial positions thereof when returning from the printing positions thereof toward the initial positions thereof, upon deenergizing said electromechanical actuator; and a flexible sheet disposed on the stopper so as to be engaged by each electromechanical actuator where returning from the printing position and toward the initial position thereof, and protecting a stopper face of the stopper from being struck and worn by the returning electromechanical actuator, the common stopper having a toothed stopper face and arranged with the flexible sheet and subject to a rotational force when being struck by each electromechanical actuator in returning to the initial position thereof.

21. A printing head as set forth in claim 20, wherein each said electromechanical actuator comprises a piezoelectric actuator.

* * * * *

UNITED STATES PATENT AND TRADEMARK OFFICE
CERTIFICATE OF CORRECTION

PATENT NO. : 5,726,521
DATED : Mar. 10, 1998
INVENTOR(S) : KON et al.

It is certified that error appears in the above-identified patent and that said Letters Patent is hereby corrected as shown below:

TITLE PAGE: Inventors: Lines 2 and 5, change "Inagi" to --Tokyo--.

Col. 1, line 21, after "(i.e., operating)" insert --costs--;
line 65, change "in" to --is--.

Signed and Sealed this

Eighteenth Day of August, 1998

Attest:

Attesting Officer

BRUCE LEHMAN

Commissioner of Patents and Trademarks